(12) United States Patent
Misaki

(10) Patent No.: US 10,992,884 B2
(45) Date of Patent: Apr. 27, 2021

(54) IMAGING PANEL AND METHOD FOR PRODUCING SAME

(71) Applicant: Sharp Kabushiki Kaisha, Osaka (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 72 days.

(21) Appl. No.: 16/473,297

(22) PCT Filed: Dec. 22, 2017

(86) PCT No.: PCT/JP2017/046241
§ 371 (c)(1),
(2) Date: Jun. 25, 2019

(87) PCT Pub. No.: WO2018/123907
PCT Pub. Date: Jul. 5, 2018

(65) Prior Publication Data
US 2019/0335116 A1 Oct. 31, 2019

(30) Foreign Application Priority Data

Dec. 27, 2016 (JP) .............. JP2016-252530

(51) Int. Cl.
*H04N 5/32* (2006.01)
*H01L 27/146* (2006.01)
(52) U.S. Cl.
CPC ......... *H04N 5/32* (2013.01); *H01L 27/14603* (2013.01); *H01L 27/14643* (2013.01); *H01L 27/14683* (2013.01)

(58) Field of Classification Search
CPC ................................. H01L 27/14603
See application file for complete search history.

(56) References Cited

U.S. PATENT DOCUMENTS

| | | |
|---|---|---|
| 2007/0113886 A1 | 5/2007 | Arao et al. |
| 2009/0189257 A1 | 7/2009 | Seki et al. |
| 2013/0048863 A1 | 2/2013 | Ohta et al. |
| 2015/0035102 A1 | 2/2015 | Ashidate |

(Continued)

FOREIGN PATENT DOCUMENTS

| | | |
|---|---|---|
| JP | 2001-77402 A | 3/2001 |
| JP | 2002-208725 A | 7/2002 |
| JP | 2007-165865 A | 6/2007 |

(Continued)

OTHER PUBLICATIONS

Official Communication issued in International Patent Application No. PCT/JP2017/046241, dated Mar. 13, 2018.

*Primary Examiner* — Yara B Green
(74) *Attorney, Agent, or Firm* — Keating & Bennett, LLP

(57) ABSTRACT

Provided is an X-ray imaging panel in which leakage current can be reduced, and a method for producing the same. An imaging panel 1 generates an image based on scintillation light that is obtained from X-rays transmitted through an object. The imaging panel 1 includes a photoelectric conversion layer 15 that converts scintillation light into charges, on a substrate. The photoelectric conversion layer 15 has a polygonal shape having a plurality of corner portions 15p when viewed in a plan view. Each of the corner portions 15p has a plurality of corners each of which has an interior angle of greater than 90°.

4 Claims, 20 Drawing Sheets

(56) References Cited

U.S. PATENT DOCUMENTS

2016/0178763 A1\* 6/2016 Okada ................. H01L 31/0272
　　　　　　　　　　　　　　　　　　　　　　250/370.09
2018/0040651 A1\* 2/2018 Lee ..................... H01L 27/1461

FOREIGN PATENT DOCUMENTS

| JP | 2009-206502 A | 9/2009 |
| JP | 2013-46043 A | 3/2013 |
| JP | 2015-32636 A | 2/2015 |
| JP | 2015-119113 A | 6/2015 |

\* cited by examiner

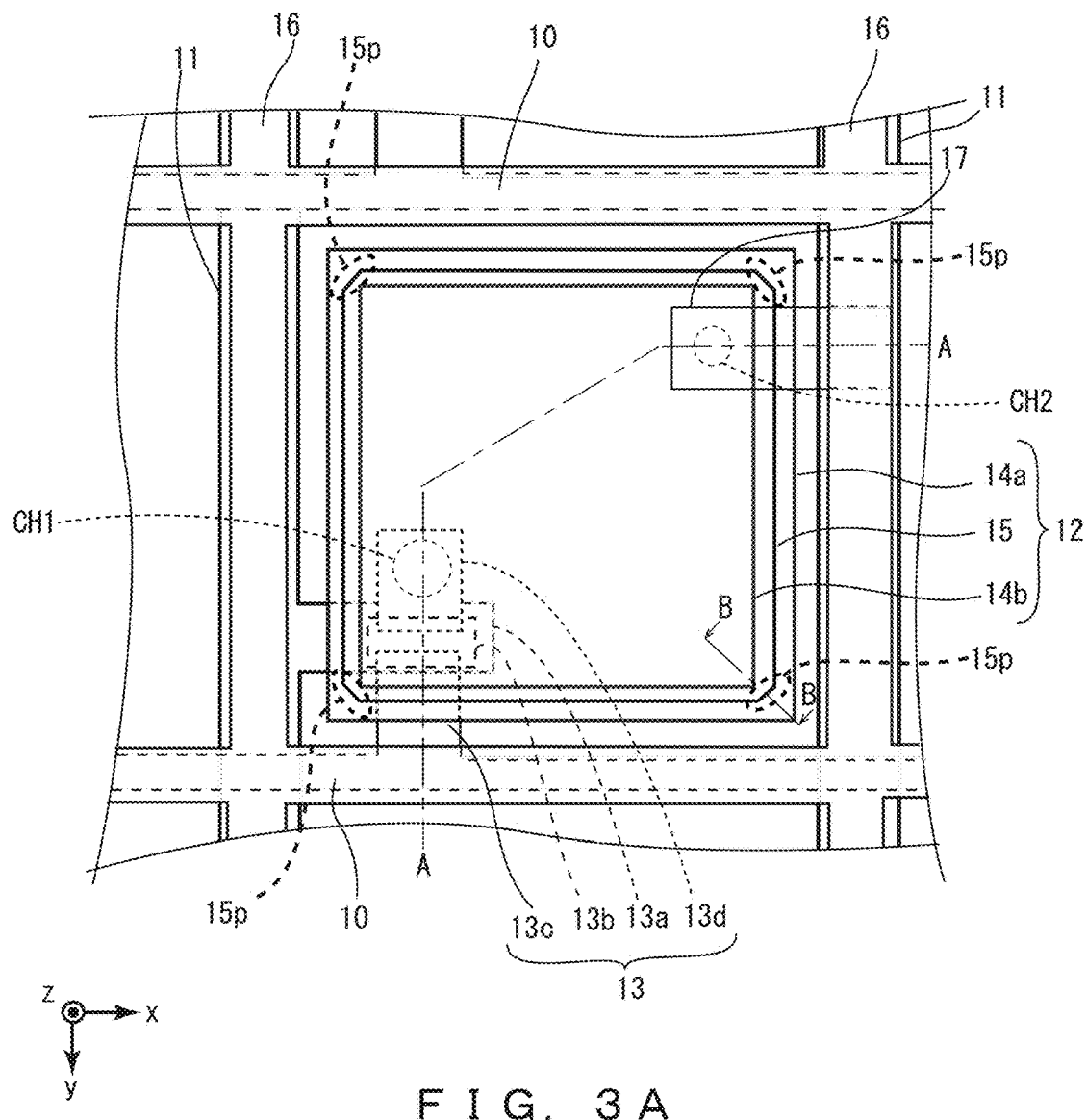
F I G. 3A
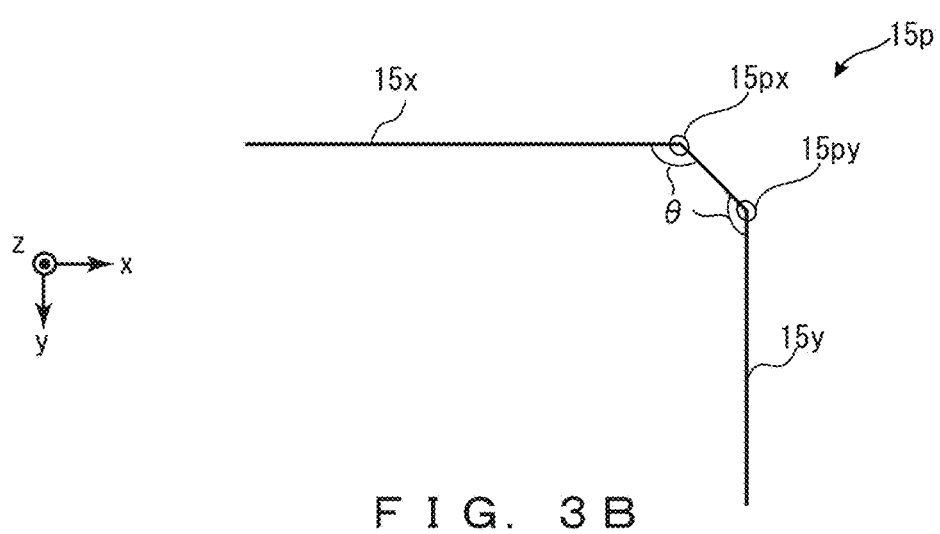
F I G. 3B

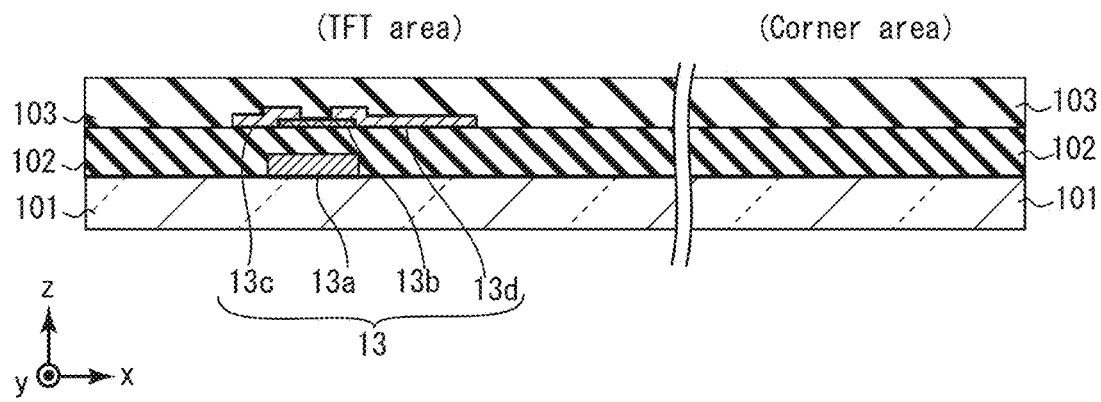
F I G. 5A
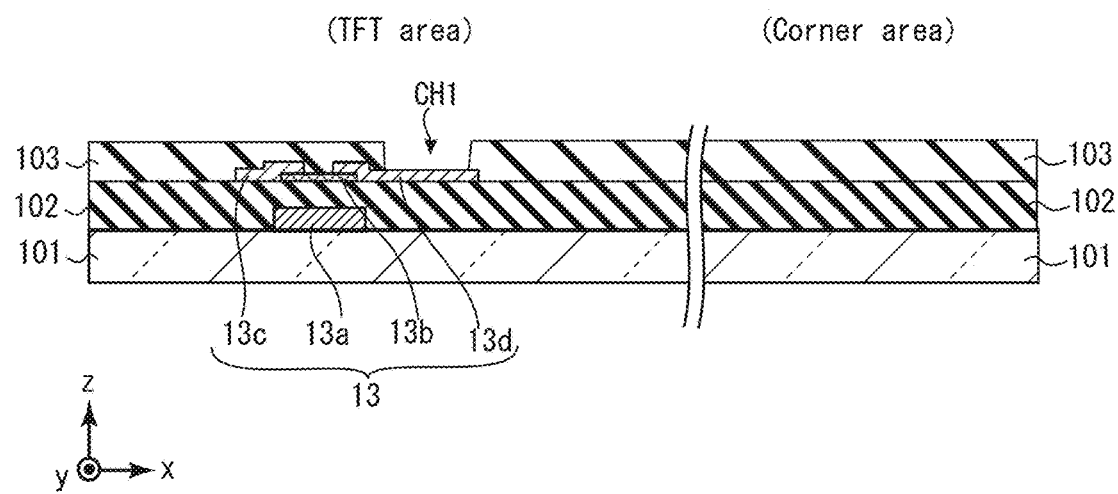
F I G. 5B
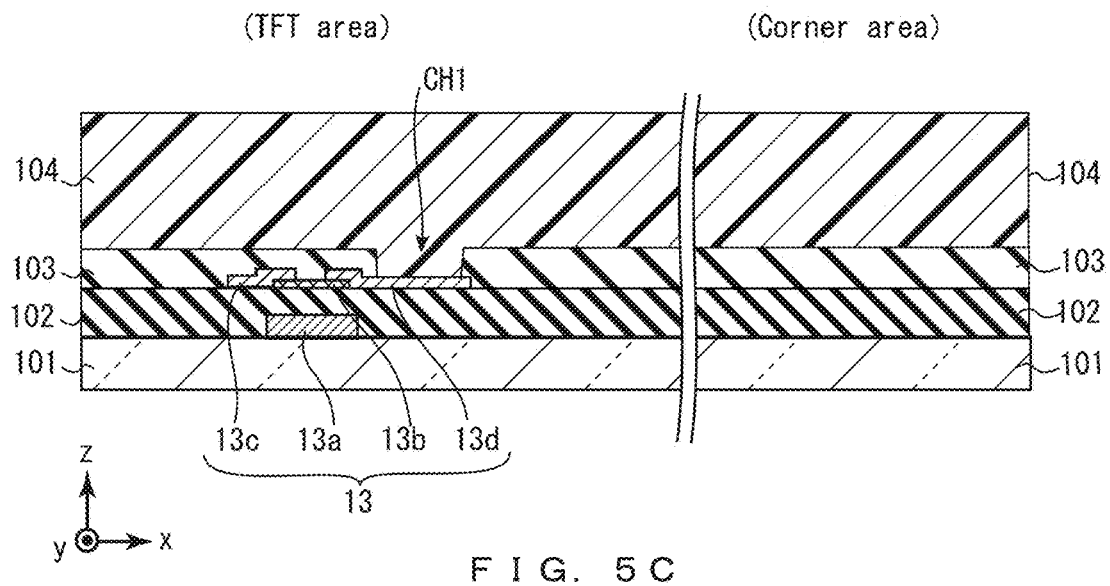
F I G. 5C

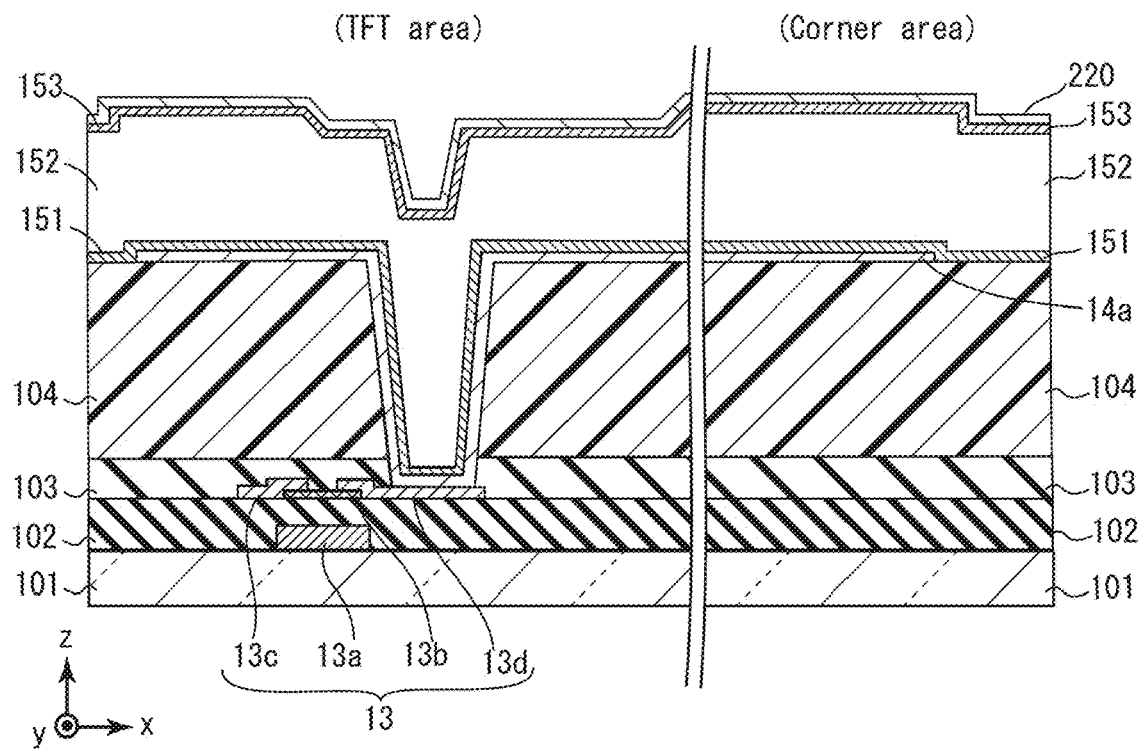
F I G. 5G
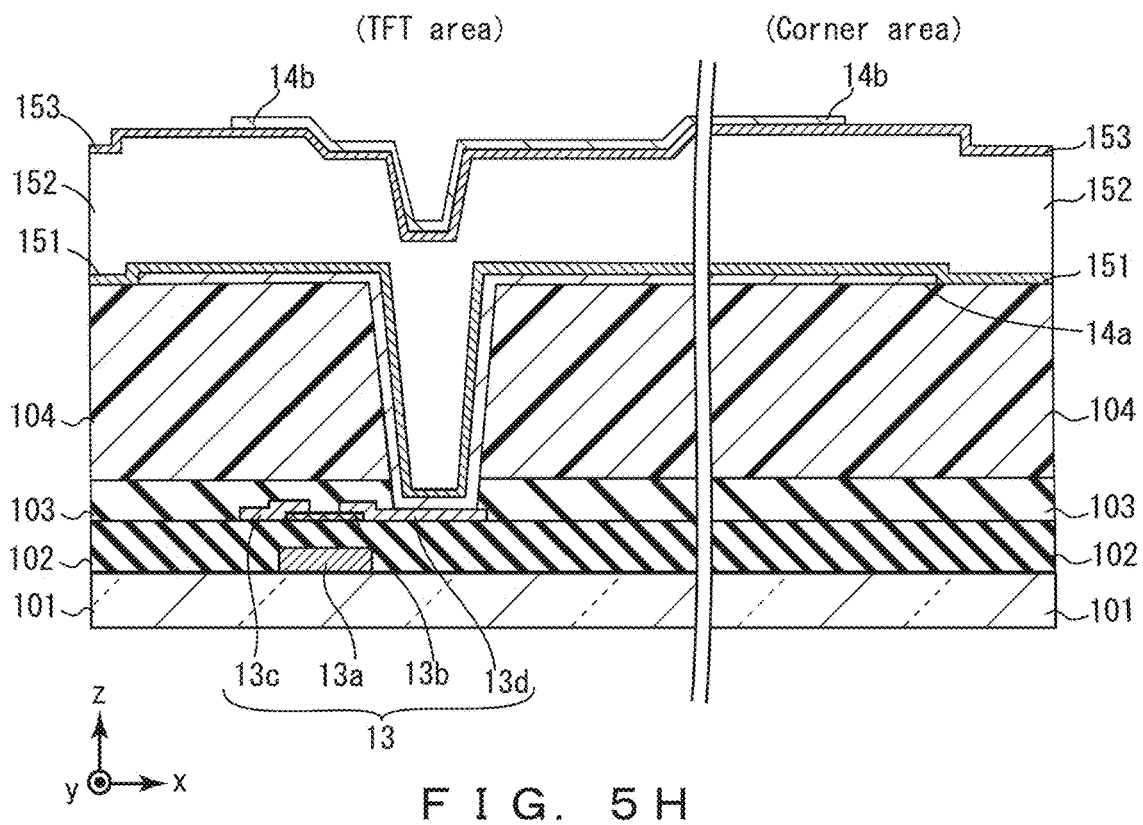
F I G. 5H

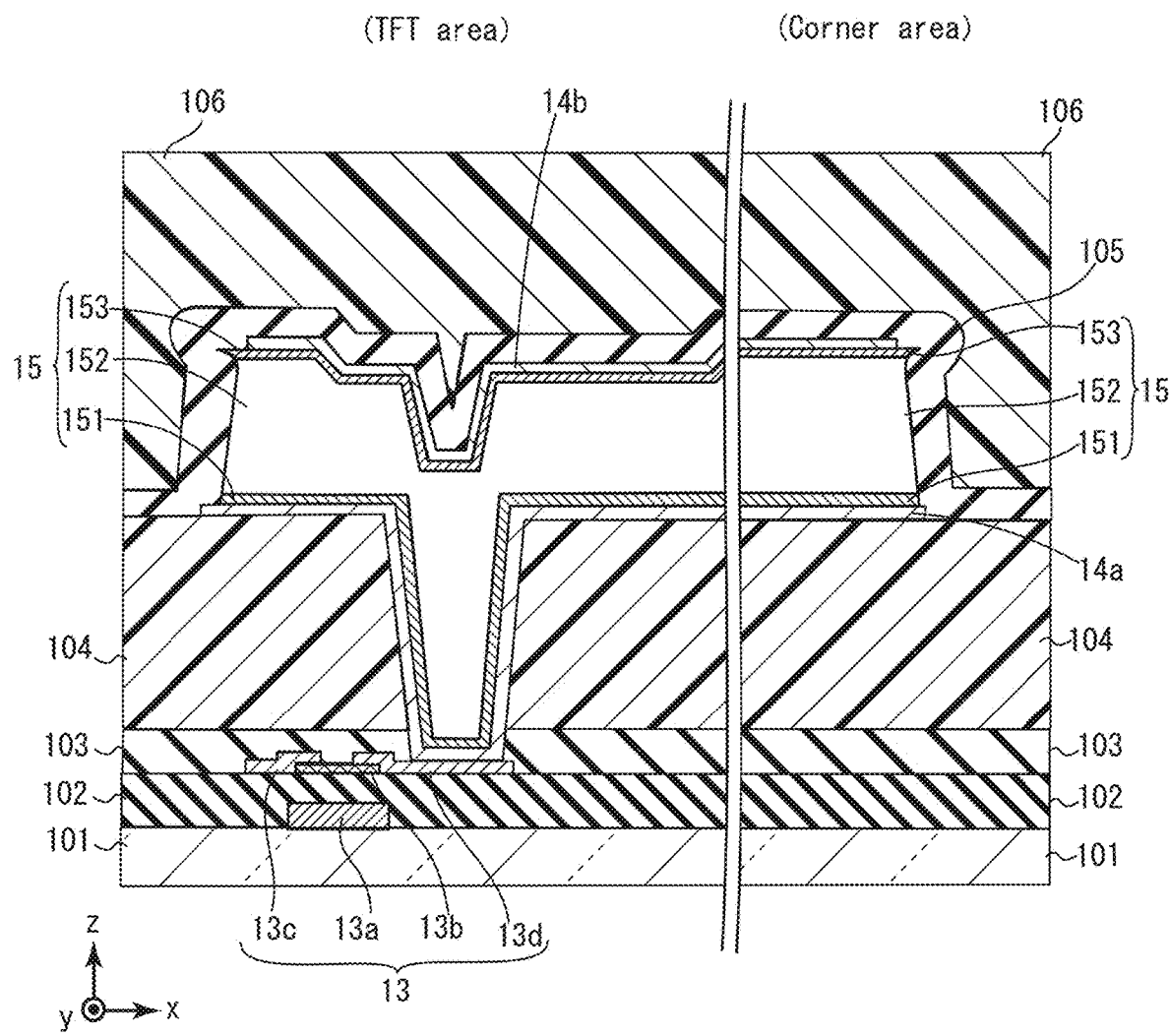
F I G. 5M

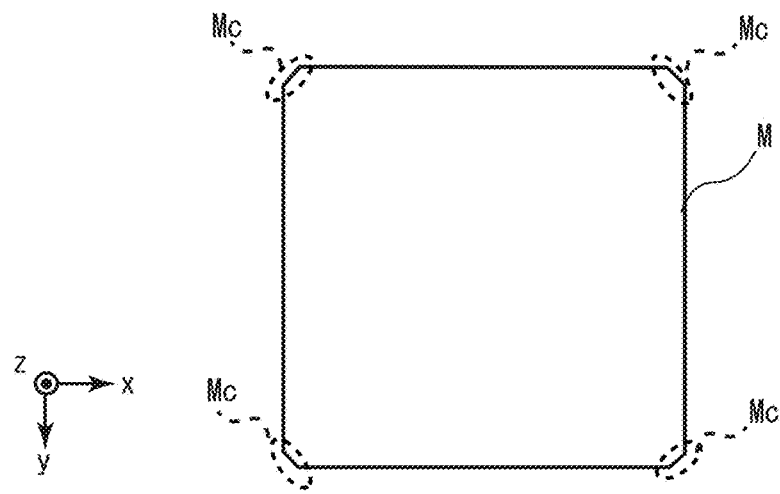
F I G. 6A
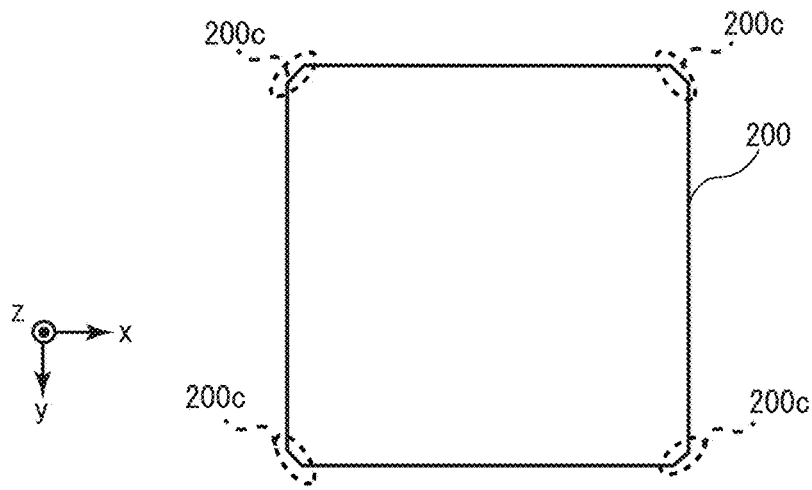
F I G. 6B
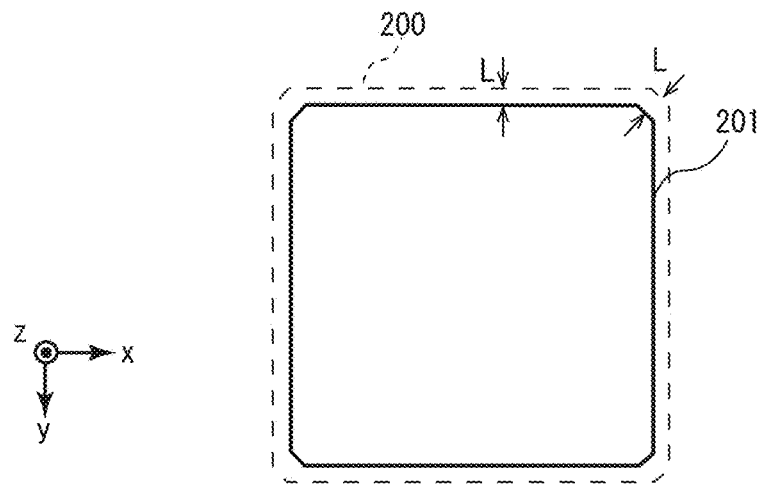
F I G. 6C

IMAGING PANEL AND METHOD FOR PRODUCING SAME

TECHNICAL FIELD

The disclosure relates to an imaging panel and a method for producing the same.

BACKGROUND ART

An X-ray imaging device that picks up an X-ray image with an imaging panel that includes a plurality of pixel portions is known. In such an X-ray imaging device, for example, irradiated X-rays are converted into charges by photodiodes. Converted charges are read out by thin film transistors (hereinafter also referred to as TFTs) that are caused to operate, the TFTs being provided in the pixel portions. With the charges being read out in this way, an X-ray image is obtained. JP-A-2013-46043 discloses such an imaging panel. The photodiode in the configuration disclosed in JP-A-2013-46043 has a PIN structure in which an n-type semiconductor layer, an i-type semiconductor layer, and a p-type semiconductor layer are laminated. On the photodiode, an upper electrode made of a transparent conductive film is provided; and under the photodiode, a lower electrode containing a metal such as aluminum is provided.

SUMMARY OF THE INVENTION

Incidentally, in a case where a resist in a rectangular shape is formed when an n-layer, an i-layer, and a p-layer are etched for forming a photoelectric conversion layer, in the step of exposing the resist, the exposure amount of a corner portion of a rectangular shape is higher than the exposure amount of a side portion of the rectangular shape, resulting in that a taper angle of the resist in the corner portion is smaller than that in the other portions. When the semiconductor film is dry-etched with use of this resist, therefore, the resist is influenced by anisotropic etching, and is recessed toward the inner side. In other words, as shown in FIG. 9, the resist R1 on the semiconductor film 600 in the corner portion and the resist R2 thereon in the side portion are turned to be a resist R1' and a resist R2', respectively, by dry etching. Here, since the resist R1 in the corner portion has a smaller taper angle than that of the resist R2 in the side portion, the resist R1 is recessed toward the inner side as compared with the resist R2. As a result, a side end 600a of the semiconductor film 600 in the side portion is in an inversely tapered shape, but on the other hand, a side end 600b of the semiconductor film 600 in the corner portion is in a normally tapered shape. The corner portion therefore tends to be damaged easily by etching, whereby it is likely that leakage current would be generated there.

It is an object of the disclosure to provide an X-ray imaging panel in which leakage current can be reduced, and a method for producing the same.

An imaging panel that achieves the above-described object is an imaging panel that generates an image based on scintillation light that is obtained from X-rays transmitted through an object, the imaging panel including: a substrate; and a photoelectric conversion layer that is provided on the substrate and converts scintillation light into charges, wherein the photoelectric conversion layer has a polygonal shape having a plurality of corner portions when viewed in a plan view, and each of the corner portions has a plurality of corners each of which has an interior angle of greater than 90°.

With the present invention, leakage current can be reduced.

BRIEF DESCRIPTION OF DRAWINGS

FIG. 3A is an enlarged plan view showing one pixel portion of the imaging panel 1 shown in FIG. 2.

FIG. 3B is an enlarged plan view schematically showing one corner portion shown in FIG. 3A.

FIG. 5A is a cross-sectional view for explaining a process for producing a TFT area and a corner area, the view showing a step of forming a first insulating film in a state in which a gate insulating film and a TFT are formed on the substrate.

FIG. 5B is a cross-sectional view showing a step of forming a contact hole CH1 in the first insulating film shown in FIG. 5A.

FIG. 5C is a cross-sectional view showing a step of forming a second insulating film on the first insulating film shown in FIG. 5B.

FIG. 5G is a cross-sectional view showing a step of forming an n-type amorphous semiconductor layer, an intrinsic amorphous semiconductor layer, and a p-type amorphous semiconductor layer that cover the lower electrode shown in FIG. 5F, and forming a transparent conductive film on the p-type amorphous semiconductor layer.

FIG. 5H is a cross-sectional view showing a step of patterning the transparent conductive film shown in FIG. 5G so as to form an upper electrode.

FIG. 5M is a cross-sectional view showing a step of forming a fourth insulating film on the third insulating film shown in FIG. 5L.

FIG. 5O is a cross-sectional view showing a step of patterning the metal film shown in FIG. 5N, and thereafter, forming a transparent conductive film on the fourth insulating film.

FIG. 6A is a plan view showing an exemplary mask pattern used when a resist is formed in the step shown in FIG. 5I.

Figure 5D:
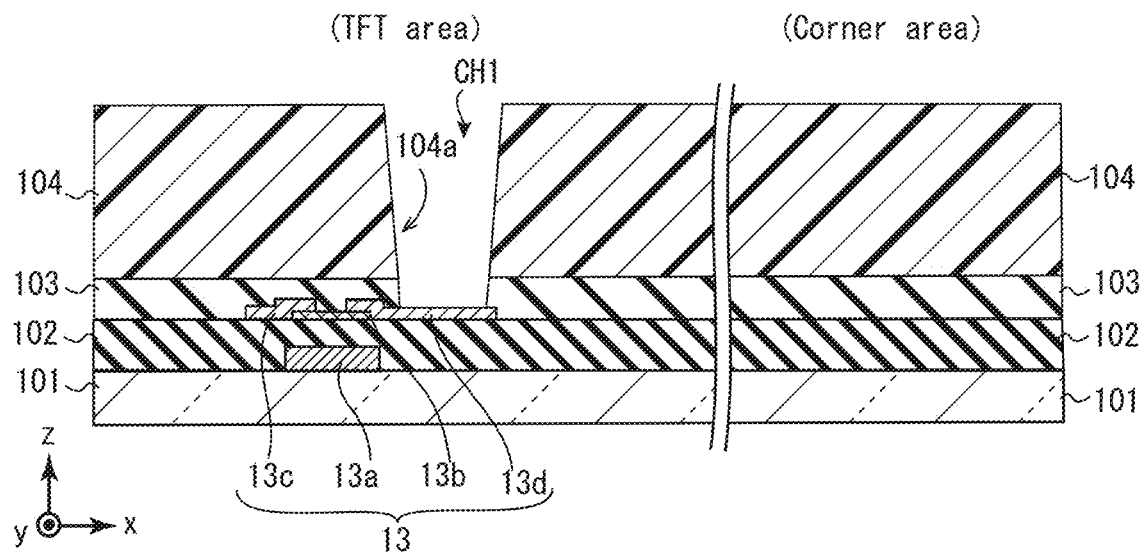
FIG. 5D is a cross-sectional view showing a step of forming an opening of the second insulating film on a contact hole CH1 shown in FIG. 5C.
Figure 5E:
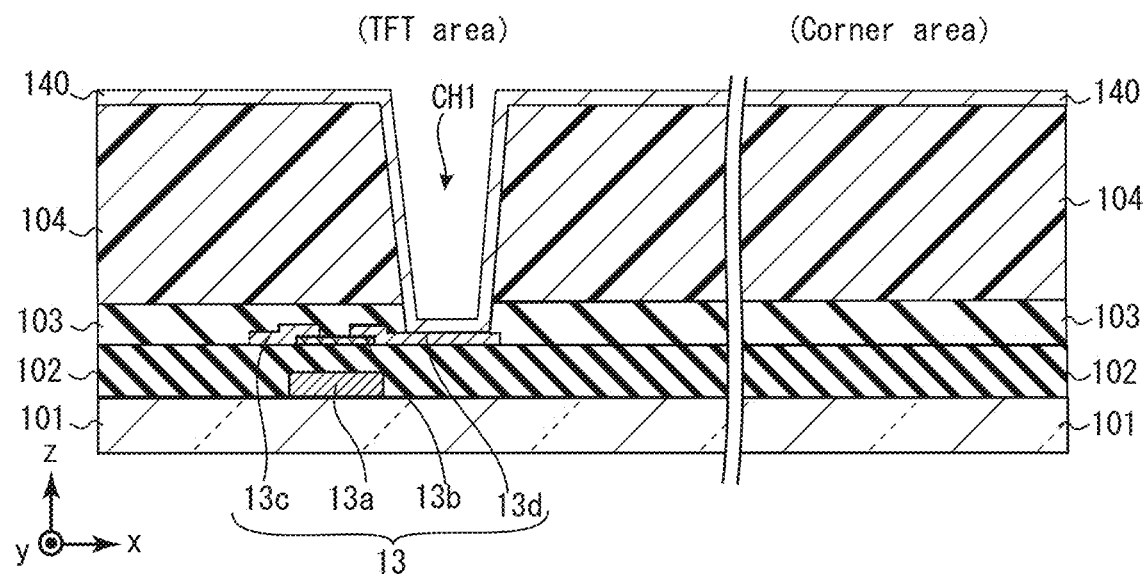
FIG. 5E is a cross-sectional view showing a step of forming a metal film on the second insulating film shown in FIG. 5D.
Figure 5F:
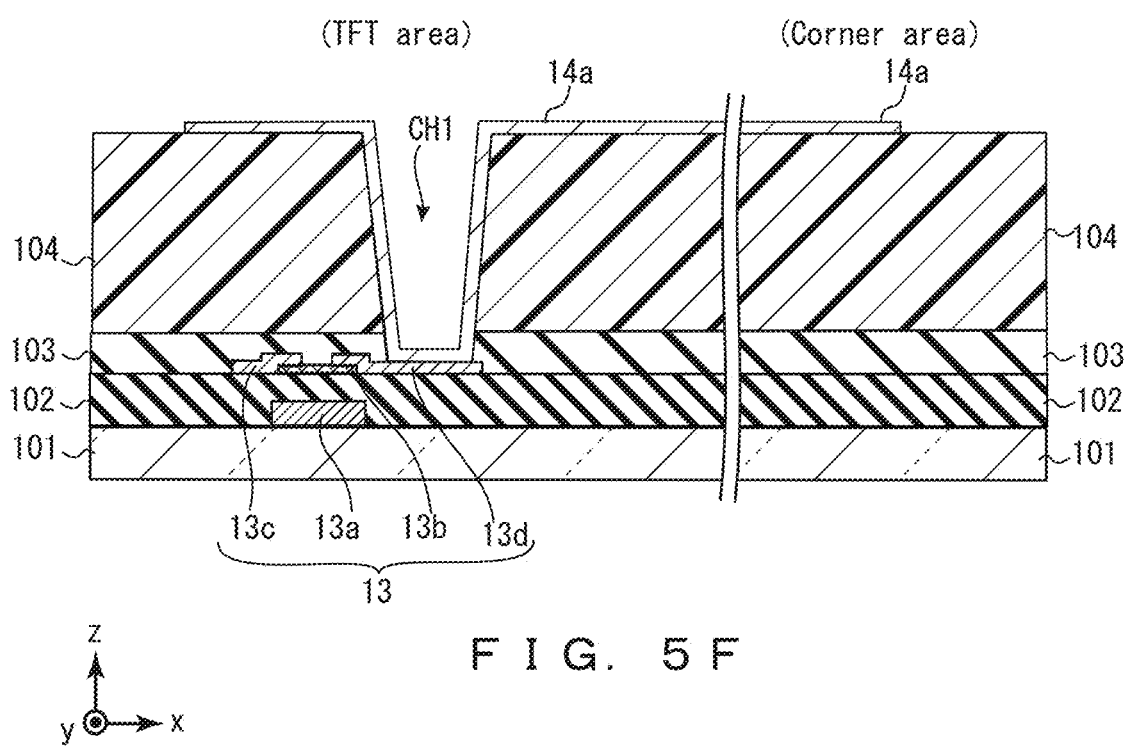
FIG. 5F is a cross-sectional view showing a step of patterning the metal film shown in FIG. 5E so as to form a lower electrode.
Figure 5I:
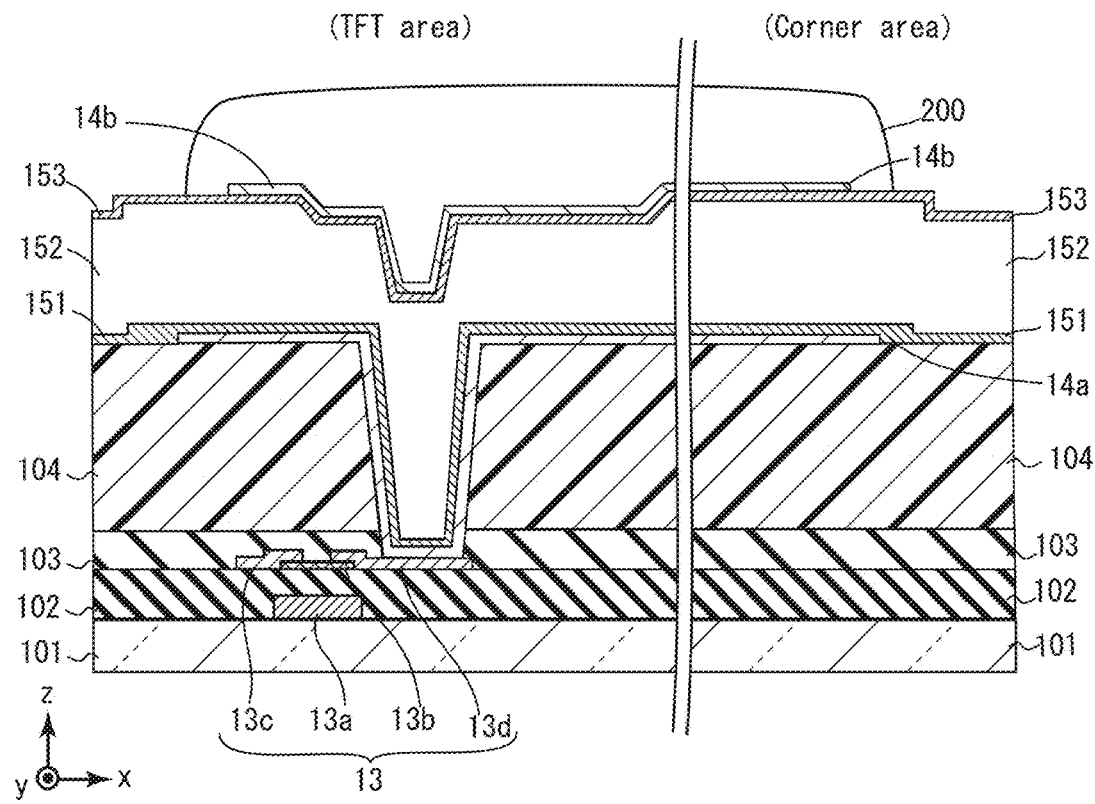
FIG. 5I is a cross-sectional view showing a step of forming a resist so that the resist covers the upper electrode shown in FIG. 5H.

FIG. GB is a plan view of the resist formed in the step shown in FIG. 5I.

Figure 5J:
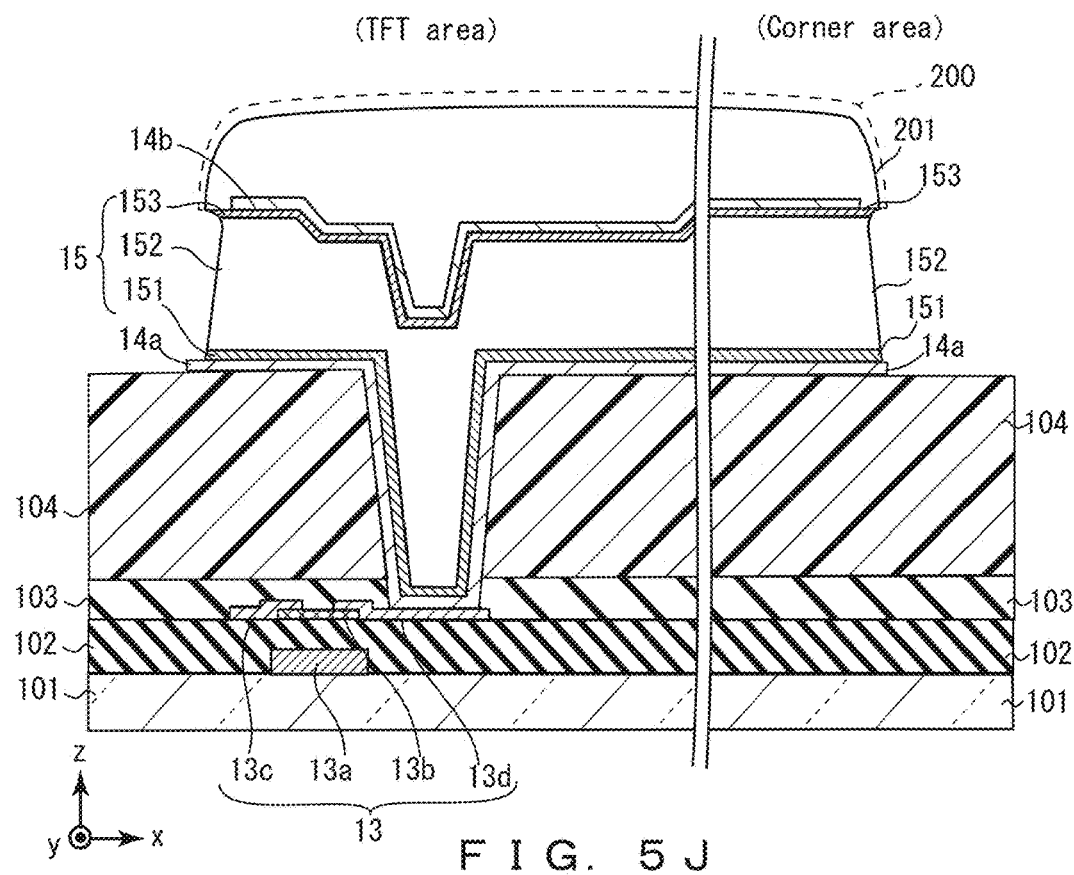
FIG. 5J is a cross-sectional view showing a step of etching the n-type amorphous semiconductor layer, the intrinsic amorphous semiconductor layer, and the p-type amorphous semiconductor layer shown in FIG. 5I, so as to form a photoelectric conversion layer.

FIG. GC is a plan view showing the resist in the states before and after the etching in the step shown in FIG. 5J.

Figure 7:
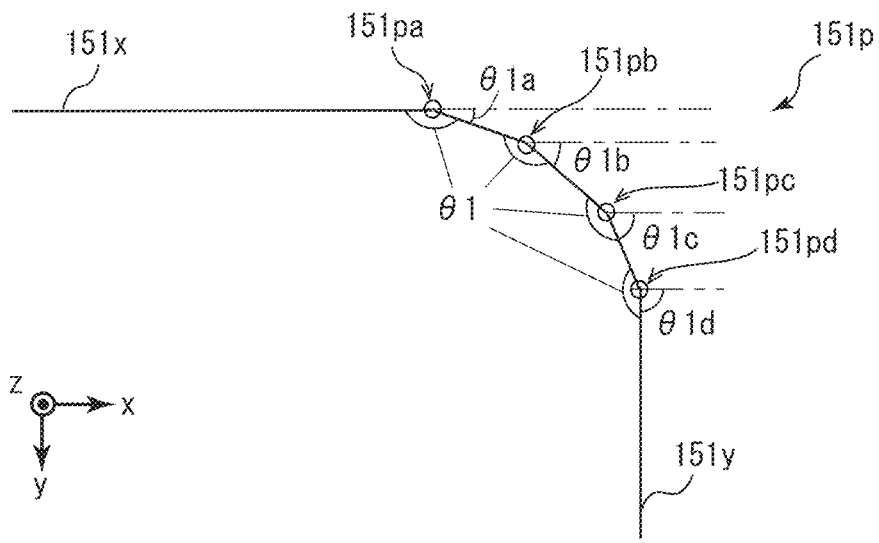

FIG. 7 is an enlarged view schematically showing a part of a photoelectric conversion layer in Example 1 of Embodiment 2.

Figure 8:
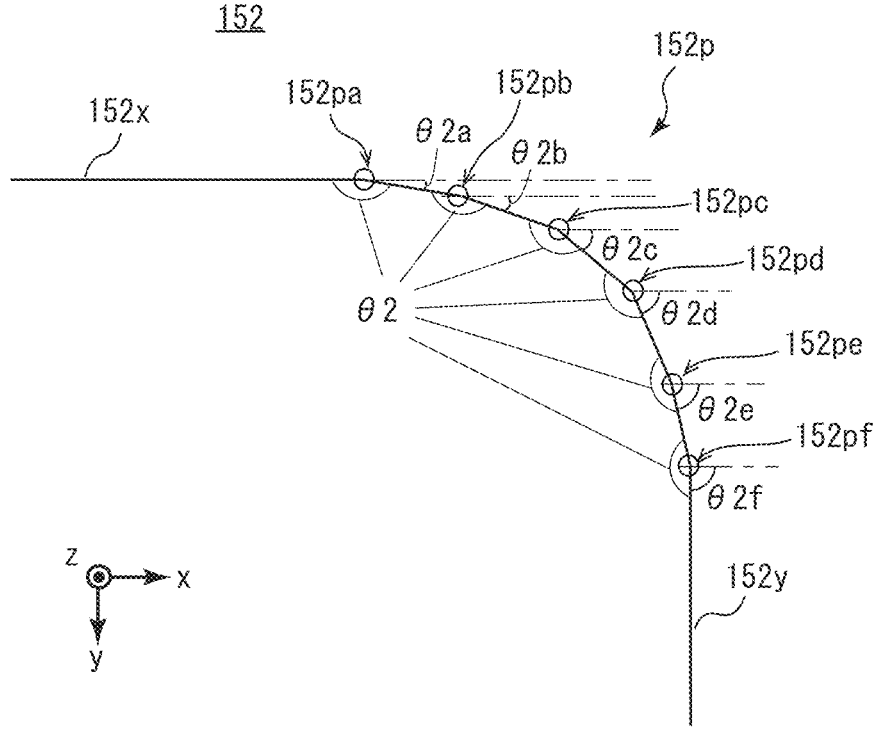

FIG. 8 is an enlarged view schematically showing a part of a photoelectric conversion layer in Example 2 of Embodiment 2.

Figure 9:
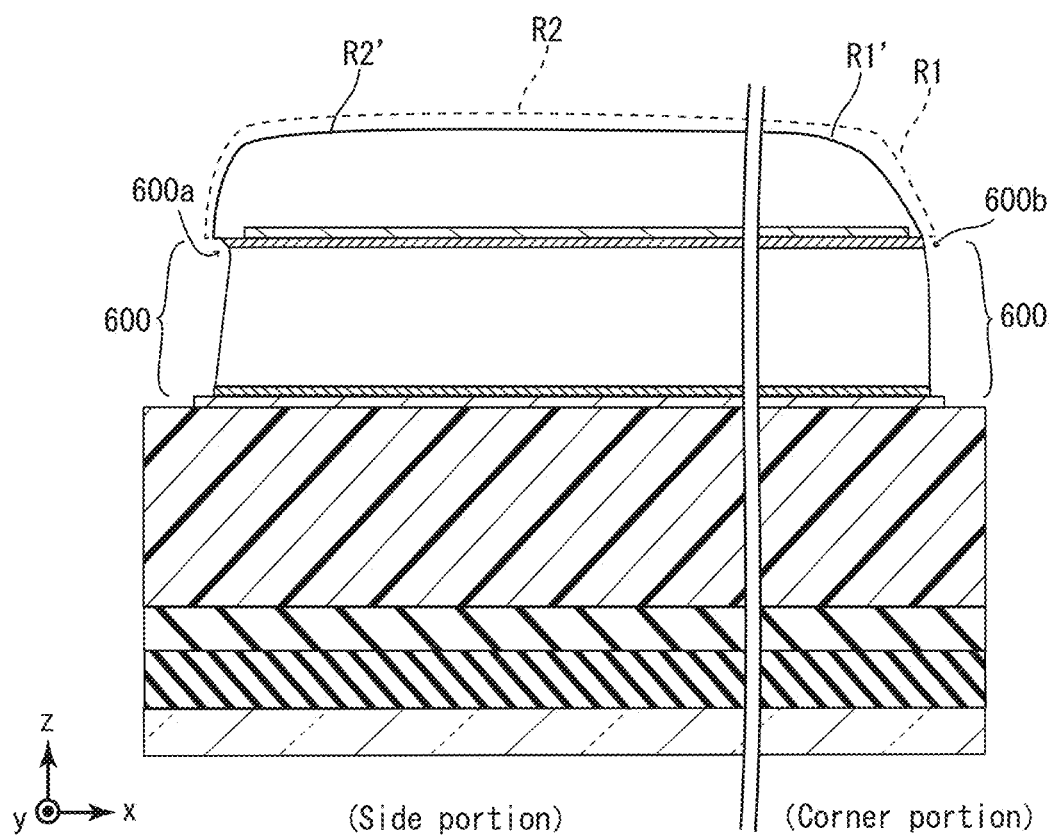

FIG. 9 is a view for explaining a step of forming a conventional photoelectric conversion layer in a rectangular shape.

MODE FOR CARRYING OUT THE INVENTION

An imaging panel according to one embodiment of the present invention is an imaging panel that generates an image based on scintillation light that is obtained from transmitted X-rays, and the imaging panel includes: a substrate; and a photoelectric conversion layer that is provided on the substrate and converts the scintillation light into charges, wherein the photoelectric conversion layer has a polygonal shape having a plurality of corner portions when viewed in a plan view, and each of the corner portions has a plurality of corners each of which has an interior angle of greater than 90° (the first configuration).

According to the first configuration, the photoelectric conversion layer has a polygonal shape having a plurality of corner portions, and each corner portion has a plurality of corners each of which has an interior angle of greater than 90°. In a case where the photoelectric conversion layer of the first configuration is formed by photolithography, the difference between the exposure amount of the resist in the corner portions and the exposure amount of the resist in the other portions is small, which makes it likely that the same tapered shapes would be achieved, as compared with a photoelectric conversion layer in a rectangular shape is formed. This therefore makes it likely that recesses of the resist caused by etching thereafter in the corner portions and in the other area would be at almost identical levels. This therefore makes it unlikely that the corner portions would have etching damage, as compared with a photoelectric conversion layer in a rectangular shape, thereby making it possible to reduce leakage current in the corner portions.

The first configuration may be further characterized in that the photoelectric conversion layer includes a first semiconductor layer of a first conductive type, an intrinsic amorphous semiconductor layer in contact with the first semiconductor layer, and a second semiconductor layer of a second conductive type that is opposite to the first conductive type, the second semiconductor layer being in contact with the intrinsic semiconductor layer, and in the corner portions, and in an area other than the corner portions, at least an upper end portion of the second semiconductor layer protrudes toward an outer side of the photoelectric conversion layer, with respect to an upper end portion of the intrinsic semiconductor layer (the second configuration).

According to the second configuration, it is unlikely that in both of the corner portions and the other area, the interface between the second semiconductor layer and the intrinsic semiconductor layer would have etching damage in the etching carried out when the photoelectric conversion layer is formed. This makes it possible to reduce leakage current in the entire photoelectric conversion layer.

The first or second configuration may be further characterized in that the interior angle of each of the corners is 135° or greater (the third configuration).

According to the third configuration, when the resist used for forming the photoelectric conversion layer is exposed, the difference between the exposure amount in the corner portions and that in the other area is further smaller, as compared with a case where the interior angle of the corner in the corner portion is smaller than 135°. As a result, it is likely that the same tapered shapes of the resist would be achieved in the corner portions and in the other area, which therefore makes it likely that recesses of the resist caused by etching would be at almost identical levels. This therefore makes it unlikely that the corner portions would have etching damage, thereby making it possible to reduce leakage current in the corner portions.

Any one of the first to third configurations may be further characterized in further including a thin film transistor formed on the substrate: an insulating film that covers the thin film transistor; an upper electrode provided on the photoelectric conversion layer; and a lower electrode that is provided under the photoelectric conversion layer and is connected with the thin film transistor, wherein the upper electrode and the lower electrode have approximately rectangular shapes, respectively, when viewed in a plan view, and a side end portion of the photoelectric conversion layer is arranged between a side end portion of the upper electrode and a side end portion of the lower electrode (the fourth configuration).

A method for producing an imaging panel according to one embodiment of the present invention is a method for producing an imaging panel that generates an image based on scintillation light that is obtained from X-rays transmitted through an object, and the producing method includes the steps of: forming a thin film transistor on a substrate; forming an insulating film on the thin film transistor; forming a contact hole in the insulating film, and forming a lower electrode connected through the contact hole with the thin film transistor; forming a first semiconductor layer of a first conductive type, an intrinsic amorphous semiconductor layer, and a second semiconductor layer of a second conductive type that is opposite to the first conductive type in this order so as to cover the lower electrode; forming an upper electrode on the second semiconductor layer; forming a resist in a polygonal shape having a plurality of corner portions when viewed in a view on the second semiconductor layer so as to cover the upper electrode, and etching the first semiconductor layer, the intrinsic semiconductor layer, and the second semiconductor layer so as to a photoelectric conversion layer in the polygonal shape; and each of the corner portions has a plurality of corners each of which has an interior angle of greater than 90° (the first producing method).

According to the first producing method, the resist used for forming the photoelectric conversion layer has a polygonal shape having a plurality of corner portions, and each corner portion includes a plurality of corners each of which has an interior angle of greater than 90°. The photoelectric conversion layer formed with use of this resist also has a polygonal shape identical to that of the resist. It is therefore likely that the same tapered shapes of the resist would be achieved in the corner portions and in the other area, as compared with a case where a photoelectric conversion layer is formed with use of a resist in a rectangular shape. This therefore makes it likely that recesses of the resist caused by etching would be at almost identical levels in the corner portions and in the other area. This therefore makes it unlikely that the corner portions would have etching damage, thereby making it possible to produce a photoelectric conversion layer in which the occurrence of leakage current is reduced.

The first producing method may be further characterized in that the etching is dry etching; and in the corner portions of the photoelectric conversion layer, and in an area thereof other than the corner portion, at least an upper end portion of the second semiconductor layer protrudes toward an outer side of the photoelectric conversion layer, with respect to an upper end portion of the intrinsic semiconductor layer (the second producing method).

According to the second producing method, dry etching is anisotropic etching, and even if the resist is recessed due to etching, therefore, it is easy to maintain the taper angle. in the corner portions of the photoelectric conversion layer, and in an area thereof other than the corner portion, an upper end portion of the second semiconductor layer protrudes toward the outer side with respect to an upper end portion of the intrinsic semiconductor layer. It is therefore unlikely that the interface between the second semiconductor layer and the intrinsic semiconductor layer would have etching damage.

The following description describes embodiments of the present invention in detail, while referring to the drawings. Identical or equivalent parts in the drawings are denoted by the same reference numerals, and the descriptions of the same are not repeated.

Embodiment 1

(Configuration)

Figure 1:
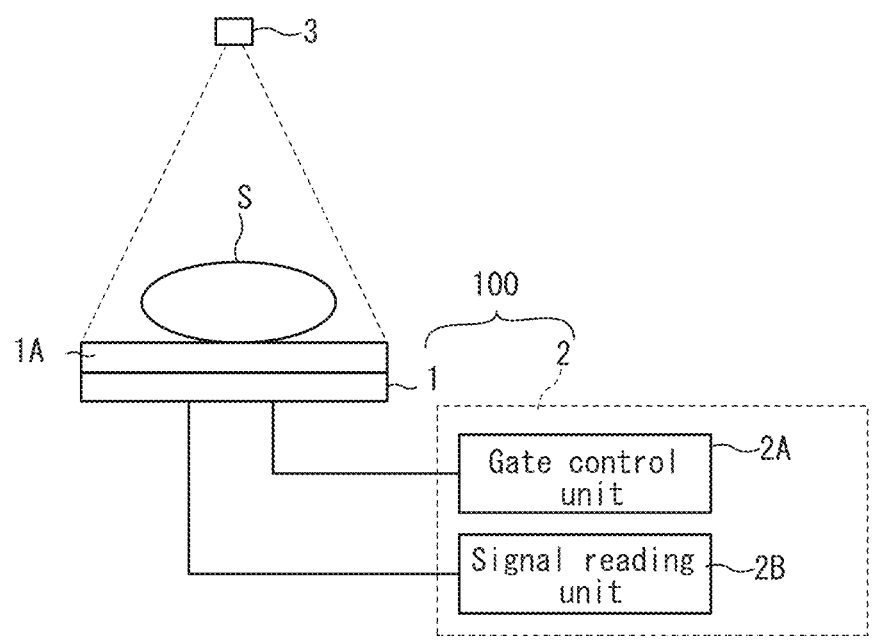
FIG. 1 is a schematic diagram of an X-ray imaging device in an embodiment.

FIG. 1 is a schematic diagram showing an X-ray imaging device in the present embodiment. The X-ray imaging device 100 includes an imaging panel 1 and a control unit 2. The control unit 2 includes a gate control unit 2A and a signal reading unit 2B. X-rays are irradiated from the X-ray source 3 to an object S, and X-rays transmitted through the object S are converted into fluorescence (hereinafter referred to as scintillation light) by a scintillator 1A provided above the imaging panel 1. The X-ray imaging device 100 acquires an X-ray image by picking up the scintillation light with the imaging panel 1 and the control unit 2.

Figure 2:
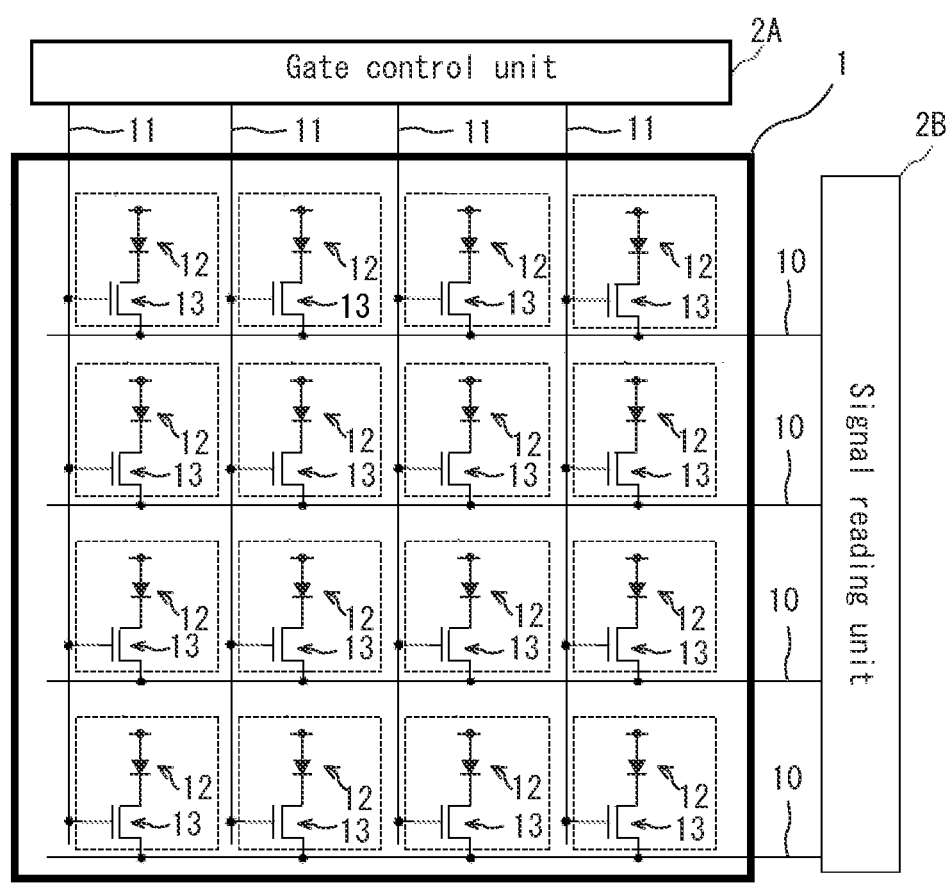
FIG. 2 is a schematic diagram showing a schematic configuration of the imaging panel shown in FIG. 1.

FIG. 2 is a schematic diagram showing a schematic configuration of the imaging panel 1. As shown in FIG. 2, a plurality of source lines 10, and a plurality of gate lines 11 intersecting with the source lines 10 are formed in the imaging panel 1. The gate lines 11 are connected with the gate control unit 2A, and the source lines 10 are connected with the signal reading unit 2B.

The imaging panel 1 includes TFTs 13 connected to the source lines 10 and the gate lines 11, at positions at which the source lines 10 and the gate lines 11 intersect. Further, photodiodes 12 are provided in areas surrounded by the source lines 10 and the gate lines 11 (hereinafter referred to as pixels). In each pixel, scintillation light obtained by converting X-rays transmitted through the object S is converted by the photodiode 12 into charges according to the amount of the light.

The gate lines 11 in the imaging panel 1 are sequentially switched by the gate control unit 2A into a selected state, and the TFT 13 connected to the gate line 11 in the selected state is turned ON. When the TFT 13 is turned ON, a signal according to the charges obtained by the conversion by the photodiode 12 is output through the source line 10 to the signal reading unit 2B.

FIG. 3A is an enlarged plan view of one pixel portion of the imaging panel 1 shown in FIG. 2. As shown in FIG. 3A, in the pixel surrounded by the gate lines 11 and the source lines 10, a lower electrode 14a, a photoelectric conversion layer 15, and an upper electrode 14b that compose the photodiode 12 are arranged so as to overlap with one another. Further, a bias line 16 is arranged so as to overlap with the gate line 11 and the source line 10 when viewed in a plan view. The bias line 16 supplies a bias voltage to the photodiode 12. The TFT 13 includes a gate electrode 13a integrated with the gate line 11, a semiconductor active layer 13b, a source electrode 13c integrated with the source line 10, and a drain electrode 13d. In the pixel, a contact hole CH1 for connecting the drain electrode 13d and the lower electrode 14a with each other is provided. Further, in the pixel, a transparent conductive film 17 is provided so as to overlap with the bias line 16, and a contact hole CH2 for connecting the transparent conductive film 17 and the upper electrode 14b with each other is provided.

As shown in FIG. 3, the lower electrode 14a and the upper electrode 14b have an approximately rectangular shape each when viewed in a plan view, and the photoelectric conversion layer 15, on the other hand, has a polygonal shape having four corner portions 15p when viewed in a plan view. FIG. 3B is an enlarged view schematically showing one corner portion 15p shown in FIG. 3A. As shown in FIG. 3B, the corner portion 15p in the present embodiment is a connecting part that connects a side 15x parallel to the X axis and a side 15y parallel to the Y axis in the photoelectric conversion layer 15, and has a corner 15px arranged on the side 15x side and a corner 15py arranged on the side 15y side. In this example, the respective interior angles of the corners 15px, 15py are about 135°.

As shown in FIG. 3A, an end of the lower electrode 14a is arranged on an outer side with respect to an end of the upper electrode 14b. An end of the photoelectric conversion layer 15 is arranged between the end of the lower electrode 14a and the end of the upper electrode 14b.

Figure 4A:
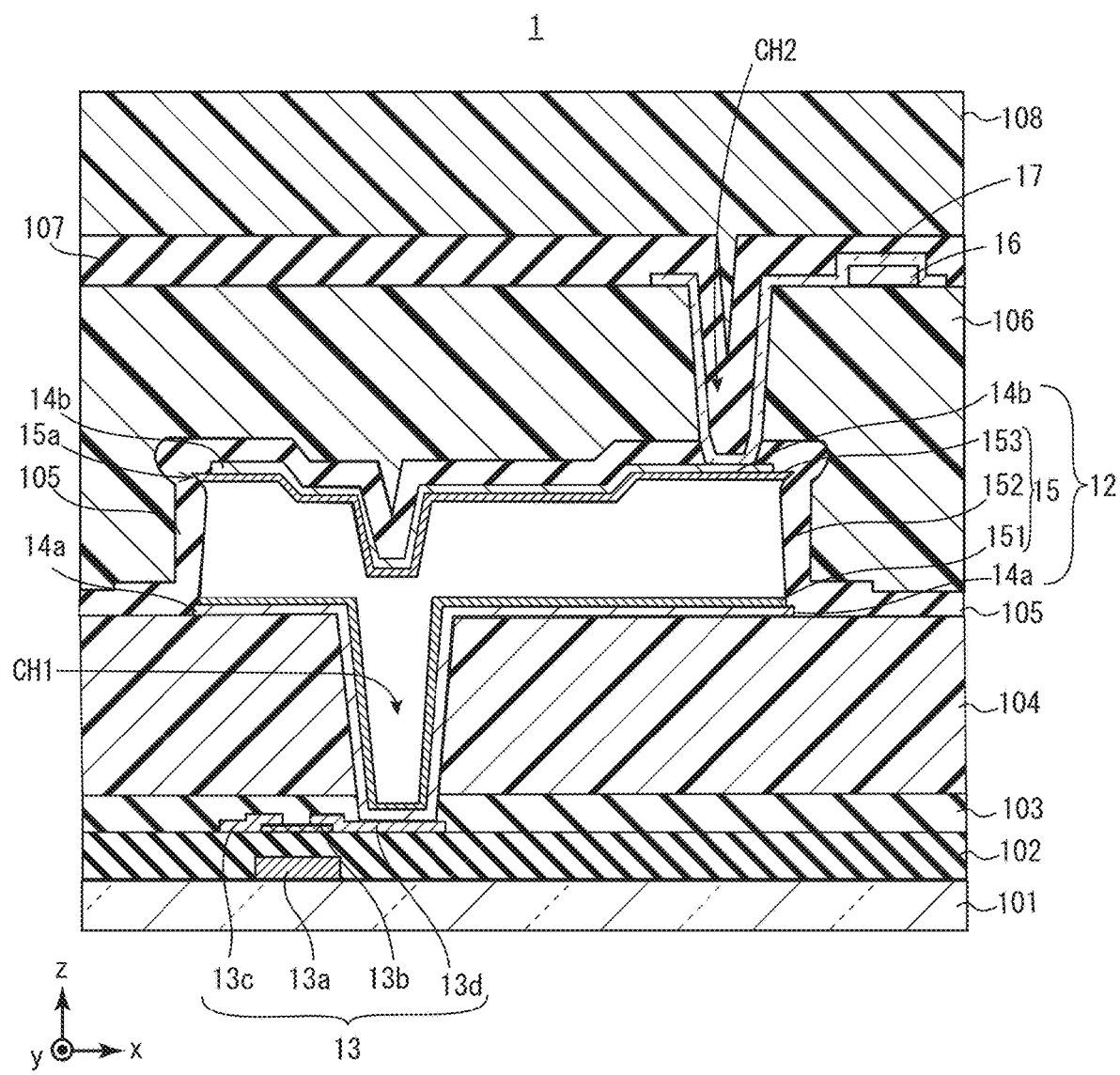
FIG. 4A is a cross-sectional view of the pixel shown in FIG. 3A, taken along the line A-A.
Figure 4B:
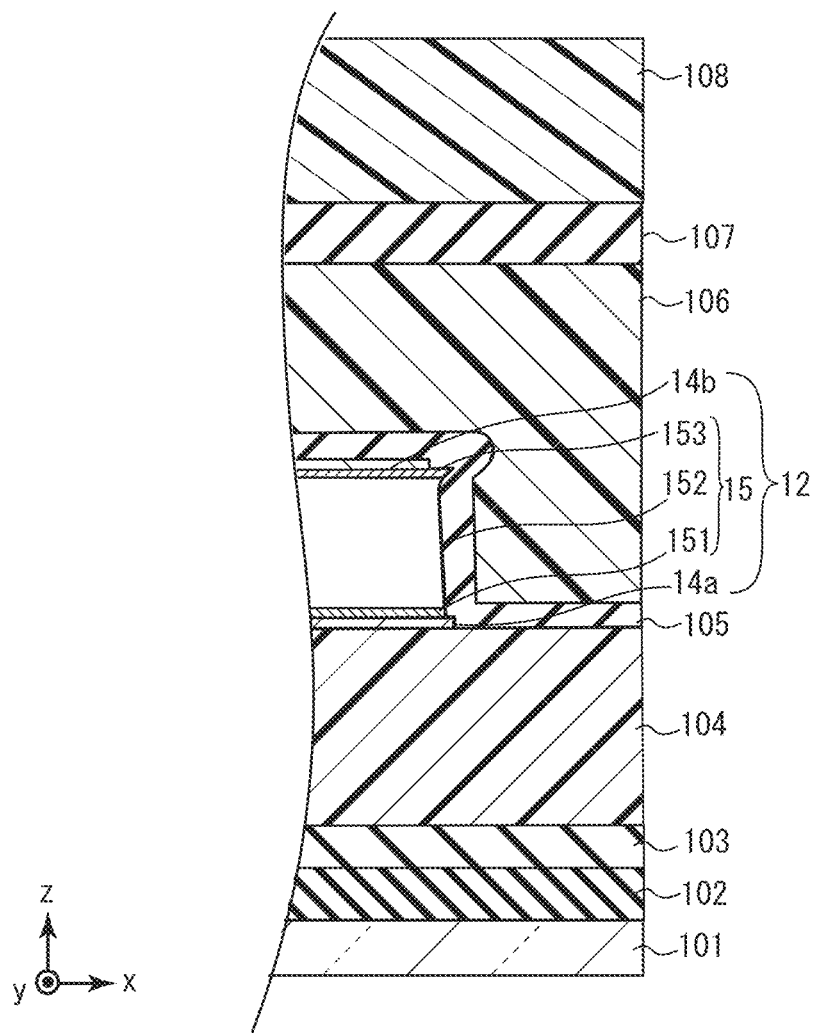
FIG. 4B is a cross-sectional view of the pixel shown in FIG. 3A, taken along the line B-B.

Here, FIG. 4A is a cross-sectional view of the pixel shown in FIG. 3A, taken along a line A-A. Further, FIG. 4B is a cross-sectional view of the pixel shown in FIG. 3A, taken along a line B-B. Hereinafter the portion of the pixel shown in FIG. 4A is referred to as a "TFT connection area", and the portion of the pixel shown in FIG. 4B is referred to as a "corner area".

As shown in FIG. 4A, in the TFT connection area on the substrate 101, a TFT 13 is formed. The substrate 101 is a substrate having insulating properties, for example, a glass substrate, a silicon substrate, a plastic substrate having heat-resisting properties, a resin substrate, or the like.

Further, in the TFT connection area, the gate electrode 13a integrated with the gate line 11 is formed. The gate electrode 13a and the gate line 11 are made of, for example, a metal such as aluminum (Al), tungsten (W), molybdenum (Mo), molybdenum nitride (MoN), tantalum (Ta), chromium (Cr), titanium (Ti), or copper (Cu), an alloy of any of these metals, or a metal nitride of these metals. In the present embodiment, the gate electrode 13a and the gate line 11 have a laminate structure in which a metal film made of molybdenum nitride and a metal film made of aluminum are laminated in this order. Regarding thicknesses of these metal films, for example, the metal film made of molybdenum nitride has a thickness of 100 nm, and the metal film made of aluminum has a thickness of 300 nm.

As shown in FIGS. 4A and 4B, a gate insulating film 102 is provided in the TFT connection area and the corner area. In the TFT connection area, the gate insulating film 102 covers the gate electrode 13a. The gate insulating film 102 may be formed with, for example, silicon oxide ($SiO_x$), silicon nitride ($SiN_x$), silicon oxide nitride ($SiO_xN_y$)(x>y), or silicon nitride oxide ($SiN_xO_y$)(x>y). In the present embodiment, the gate insulating film 102 is formed with a laminate film obtained by laminating silicon oxide ($SiO_x$) and silicon nitride ($SiN_x$) in the order, and regarding the thicknesses of these films, the film of silicon oxide ($SiO_x$) has a thickness of 50 nm, and the film of silicon nitride ($SiN_x$) has a thickness of 400 nm.

As shown in FIG. 4A, in the TFT connection area, the semiconductor active layer 13b, as well as the source electrode 13c and the drain electrode 13d connected with the semiconductor active layer 13b are formed on the gate electrode 13a with the gate insulating film 102 being interposed therebetween.

The semiconductor active layer 13b is formed in contact with the gate insulating film 102. The semiconductor active layer 13b is made of an oxide semiconductor. For forming the oxide semiconductor, for example, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); InSnZnO (containing iridium (In), tin (Sn), and zinc (Zn)); material based on indium (In)-aluminum (Al)-zinc (Zn)-oxygen (O); or an amorphous oxide semiconductor containing indium (In), gallium (Ga), and zinc (Zn) at a predetermined ratio. Further, as an oxide semiconductor, "amorphous" materials, and "crystalline" materials (including polycrystalline materials, microcrystalline materials, and c-axis alignment crystalline materials) are applicable. In the case of the laminate structure, any combination is applicable (any particular combination is not excluded). In the present embodiment, the semiconductor active layer 13b is made of an amorphous oxide semiconductor containing indium (In), gallium (Ga), and zinc (Zn) at a predetermined ratio, and has a thickness of, for example, 70 nm. By applying a semiconductor active layer 13b, and an oxide semiconductor containing indium (In), gallium (Ga), zinc (Zn), and oxygen (O), off-leakage current of the TFT 13 can be reduced, as compared with amorphous silicon (a-Si). When off-leakage current of the TFT 13 is small, off-leakage current of the photoelectric conversion layer 15 is reduced, whereby quantum efficiency (QE) of the photoelectric conversion layer 15 is improved, which results in that the X-ray detection sensitivity can be improved.

As shown in FIG. 4A, in the TFT connection area, the source electrode 13c and the drain electrode 13d are formed in contact with the semiconductor active layer 13b and the gate insulating film 102. The source electrode 13c is integrated with the source line 10. The drain electrode 13d is connected with the lower electrode 14a through the contact hole CH1.

The source electrode 13c and the drain electrode 13d are formed in the same layer, and are made of, for example, a metal such as aluminum (Al), tungsten (W), molybdenum (Mo), tantalum (Ta), chromium (Cr), titanium (Ti), or copper (Cu), or alternatively, an alloy of any of these, or a metal nitride of any of these. Further, as the material for the source electrode 13c and the drain electrode 13d, the following material may be used: a material having translucency such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride; or a material obtained by appropriately combining any of these.

The source electrode 13c and the drain electrode 13d may be, for example, a laminate of a plurality of metal films. More specifically, the source electrode 13c, the source line 10, and the drain electrode 13d have a laminate structure in which a metal film made of molybdenum nitride (MoN), a metal film made of aluminum (Al), and a metal film made of molybdenum nitride (MoN) are laminated in this order. Regarding the thicknesses of the films, the metal film in the lower layer, which is made of molybdenum nitride (MoN), has a thickness of 100 nm, the metal film made of aluminum (Al) has a thickness of 500 nm, and the metal film in the upper layer, which is made of molybdenum nitride (MoN), has a thickness of 50 nm.

As shown in FIG. 4A, a first insulating film 103 is provided so as to cover the source electrode 13c and the drain electrode 13d in the TFT connection area. Further, as shown in FIG. 4B, in the corner area, the first insulating film 103 is provided on the gate insulating film 102. The first insulating film 103 may have a single layer structure made of silicon oxide ($SiO_2$) or silicon nitride (SiN), or a laminate structure obtained by laminating silicon nitride (SiN) and silicon oxide ($SiO_2$) in this order.

As shown in FIGS. 4A and 4B, on the first insulating film 103, a second insulating film 104 is formed. The second insulating film 104 is made of an organic transparent resin, for example, acrylic resin or siloxane-based resin, and has a thickness of, for example, 2.5 µm.

As shown in FIG. 4A, in the TFT connection area, the contact hole CH1, passing through the second insulating film 104 and the first insulating film 103, is formed on the drain electrode 13d.

In FIG. 4A, the lower electrode 14a, which is connected with the drain electrode 13d through the contact hole CH1, is formed on the second insulating film 104 in the TFT connection area. Further, in FIG. 4B, the lower electrode 14a is formed on the second insulating film 104 in the corner area. The lower electrode 14a is formed with, for example, a metal film obtained by laminating molybdenum (Mo), aluminum (Al), and molybdenum (Mo). These metal films have thicknesses of, for example, 50 nm, 150 nm, and 100 nm, respectively, in the order from the lower layer.

As shown in FIGS. 4A and 4B, the photoelectric conversion layer 15, whose width in X-axis direction is smaller than that of the lower electrode 14a, is formed on the lower electrode 14a, The photoelectric conversion layer 15 has a PIN structure that is obtained by laminating an n-type amorphous semiconductor layer 151, an intrinsic amorphous semiconductor layer 152, and a p-type amorphous semiconductor layer 153 in the order.

The n-type amorphous semiconductor layer 151 is made of amorphous silicon doped with an n-type impurity (for example, phosphorus). The n-type amorphous semiconductor layer 151 has a thickness of, for example, 30 nm.

The intrinsic amorphous semiconductor layer 152 is made of intrinsic amorphous silicon. The intrinsic amorphous semiconductor layer 152 is formed in contact with the n-type amorphous semiconductor layer 151. The intrinsic amorphous semiconductor layer has a thickness of, for example, 1000 nm.

The p-type amorphous semiconductor layer 153 is made of amorphous silicon doped with a p-type impurity (for example, boron). The p-type amorphous semiconductor layer 153 is formed in contact with the intrinsic amorphous semiconductor layer 152. The p-type amorphous semiconductor layer 153 has a thickness of, for example, 5 nm.

As shown in FIGS. 4A and 4B, in the TFT connection area and the corner area, the photoelectric conversion layer 15 has such a shape that the upper end portion of the p-type amorphous semiconductor layer 153 protrudes toward the outer side of the photoelectric conversion layer 15, as compared with the upper end portion of the intrinsic amorphous semiconductor layer 152.

On the p-type amorphous semiconductor layer 153, the upper electrode 14b is formed. The upper electrode 14b has a smaller width in the X-axis direction than that of the photoelectric conversion layer 15. The upper electrode 14b is made of, for example, indium tin oxide (ITO), and has a thickness of, for example, 70 nm.

A third insulating film 105 is formed so as to cover the photodiode 12. The third insulating film 105 is, for example, an inorganic insulating film made of silicon nitride (SiN), and has a thickness of, for example, 300 nm.

As shown in FIG. 4A, in the third insulating film 105 in the TFT connection area, a contact hole CH2 is formed at such a position that the contact hole CH2 overlaps with the upper electrode 14b. As shown in FIGS. 4A and 4B, on the third insulating film 105, in an area thereof except for the contact hole CH2, a fourth insulating film 106 is formed. The fourth insulating film 106 is formed with an organic transparent resin made of, for example, acrylic resin or siloxane-based resin, and has a thickness of, for example, 2.5 μm.

As shown in FIG. 4A, in the TFT connection area, on the fourth insulating film 106, the bias line 16 is formed. Further, on the fourth insulating film 106, the transparent conductive film 17 is formed so as to overlap with the bias line 16. The transparent conductive film 17 is in contact with the upper electrode 14b at the contact hole CH2. The bias line 16 is connected to the control unit 2 (see FIG. 1). The bias line 16 applies a bias voltage through the contact hole CH2 to the upper electrode 14b, the bias voltage being input from the control unit 2. The bias line 16 has a laminate structure that is obtained by laminating, for example, a metal film made of molybdenum nitride (MoN), a metal film made of aluminum (Al), and a metal film made of titanium (Ti) in this order. The films of molybdenum nitride (MoN), aluminum (Al), and titanium (Ti) have thicknesses of, for example, 100 nm, 300 nm, and 50 nm, respectively.

As shown in FIGS. 4A and 4B, on the fourth insulating film 106, a fifth insulating film 107 is formed so as to cover the transparent conductive film 17. The fifth insulating film 107 is an inorganic insulating film made of, for example, silicon nitride (SiN), and has a thickness of, for example, 200 nm.

On the fifth insulating film 107, a sixth insulating film 108 is formed. The sixth insulating film 108 is made of, for example, an organic transparent resin such as acrylic resin or siloxane-based resin, and has a thickness of, for example, 2.0 μm.

(Method for Producing Imaging Panel 1)

Figure 5K:
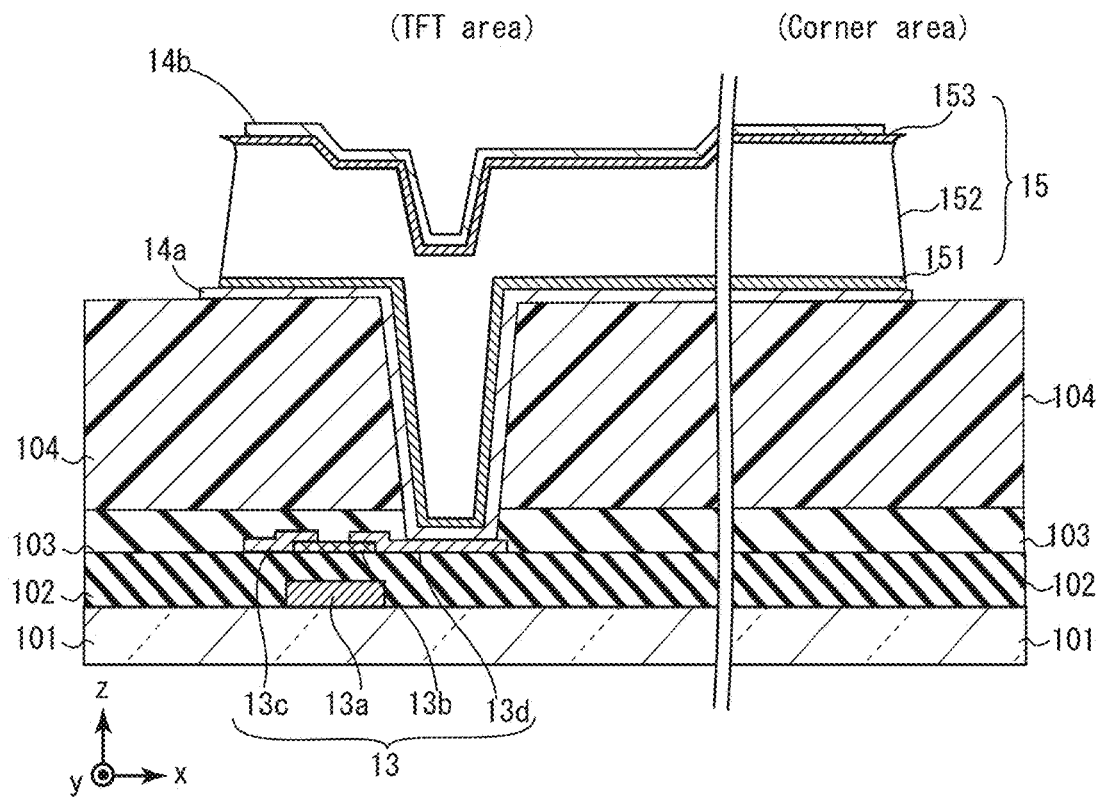
FIG. 5K is a cross-sectional view showing a state in which the resist shown in FIG. 5J is removed.

Next, the following description describes a method for producing the imaging panel 1. FIGS. 5A to 5R are cross-sectional views of the TFT area where the TFT 13 is formed, and the corner area, in the imaging panel 1 producing process.

As shown in FIG. 5A, the gate insulating film 102 and the TFT 13 are formed on the substrate 101 by a known method, and the first insulating film 103 made of silicon nitride (SiN) is formed by, for example, plasma CVD, so as to cover the TFT 13.

Subsequently, a heat treatment at about 350° C. is applied to an entire surface of the substrate 101, and photolithography and wet etching are carried out so that the first insulating film 103 is patterned, whereby a contact hole CH1 is formed on the drain electrode 13d (see FIG. 5B).

Next, the second insulating film 104 made of acrylic resin or siloxane-based resin is formed on the first insulating film 103 by, for example, slit coating (see FIG. 5C).

Then, an opening 104a of the second insulating film 104 is formed by photolithography on the contact hole CH1 (see FIG. 5D).

Subsequently, on the second insulating film 104, a metal film 140 obtained by laminating molybdenum (Mo), aluminum (Al), and molybdenum (Mo) in the order by, for example, sputtering is formed (see FIG. 5E).

Then, photolithography and wet etching are carried out, whereby the metal film 140 is patterned. Through these steps, on the second insulating film 104, there are formed the lower electrode 14a that is connected with the drain electrode 13d through the contact hole CH1 (see FIG. 5F).

Subsequently, the n-type amorphous semiconductor layer 151 the intrinsic amorphous semiconductor layer 152, and the p-type amorphous semiconductor layer 153 are formed in the stated order by, for example, plasma CVD, so as to cover the lower electrode 14a. Then, on the p-type amorphous semiconductor layer 153, for example, a transparent conductive film 240 made of ITO is formed (see FIG. 5G).

Photolithography and dry etching are carried out so as to pattern the transparent conductive film 240, whereby the upper electrode 14b whose end is arranged on the inner side with respect to the end of the lower electrode 14a is formed on the p-type amorphous semiconductor layer 153 (see FIG. 5H).

Subsequently, a resist is applied over the p-type amorphous semiconductor layer 153 so as to cover the upper electrode 14b, and a resist 200 in a polygonal shape having a plurality of corner portions is formed by photolithography (see FIG. 5I). More specifically, a mask pattern M arranged in an area where one photoelectric conversion layer 15 is formed is in a polygonal shape having four corner portions Mc as shown in FIG. 6A, and each corner portion has two corners each of which has an interior angle of 135°. In this example, the length in the X-axis direction and the length in the Y-axis direction of one corner portion are 3 μm each, Incidentally, the size of the corner portion, that is, the length thereof in the X-axis direction and the length thereof in the Y-axis direction are preferably in a range of 0.5 μm to 10.0 μm. The resist is exposed with use of this mask pattern M, and is developed. As compared with a case where the mask pattern M is in a rectangular shape, it is unlikely that the exposure amount of the corner in the corner portion would increase. The shape of the resist 200 in the FIG. 5I when viewed from the Z-axis positive direction side is therefore a polygonal shape having four corner portions 200c as shown in FIG. 6B, as is the case with the mask pattern M. Further, as shown in FIG. 5I, the taper angle of the resist 200 in the TFT area and that in the corner area are almost identical.

Next, dry etching is carried out for the patterning of the n-type amorphous semiconductor layer 151, the intrinsic amorphous semiconductor layer 152, and the p-type amorphous semiconductor layer 153, in which parts thereof not covered with the resist 200 shown in FIG. 5I are removed, Through these steps, the photoelectric conversion layer 15, whose width in the X-axis direction is smaller than that of the lower electrode 14a, and in which the upper end portion of the p-type amorphous semiconductor layer 153 protrudes toward the outer side with respect to the upper end portion of the intrinsic amorphous semiconductor layer 152, is formed (see FIG. 5J). As the resist 200 is recessed toward the inner side due to dry etching, the resist 200 has a smaller size thereby becoming the resist 201, as shown in FIGS. 5J and 6O. Here, the distance L for which the resist 200 is recessed toward the inner side is about 1 μm in both of the TFT area and the corner area. Since dry etching is anisotropic etching, the upper end portion of the p-type amorphous semiconductor layer 153 in the TFT area and the corner area protrudes toward the outer side with respect to the upper end portion of the intrinsic amorphous semiconductor layer 152, thereby becoming in an inversely tapered shape.

Figure 5L:
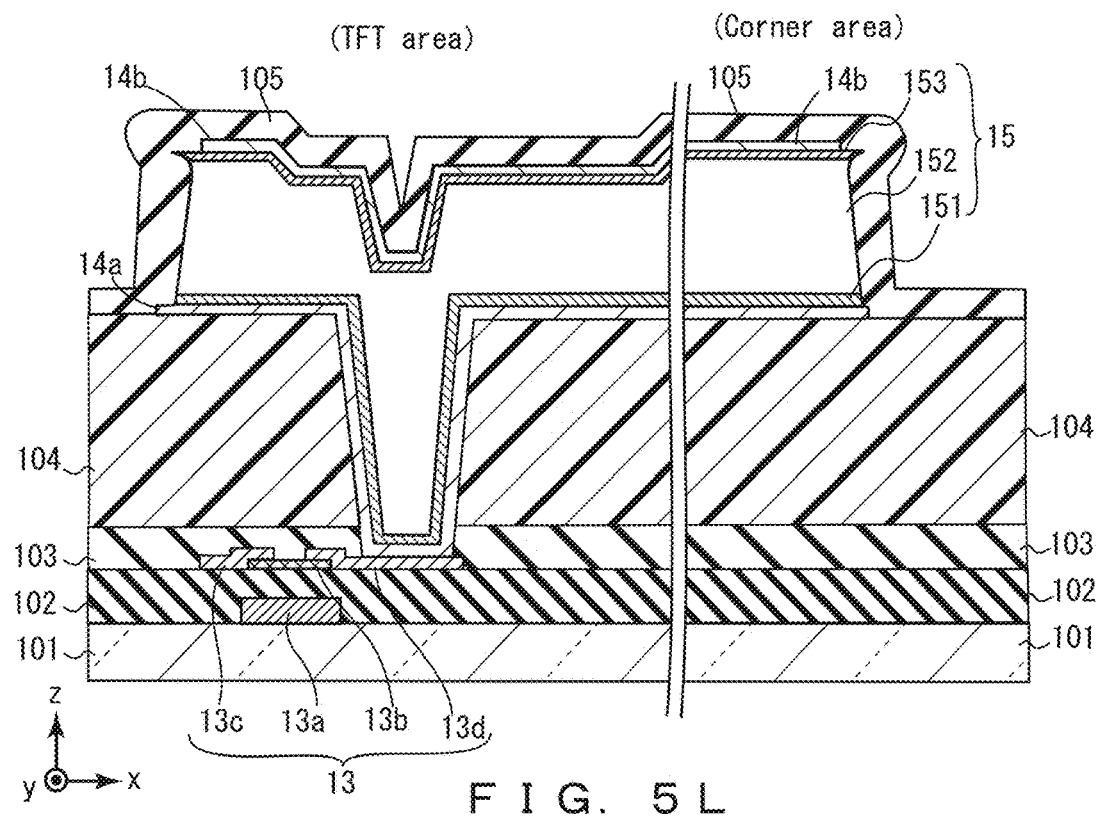
FIG. 5L is a cross-sectional view showing a step of forming a third insulating film so that the third insulating film covers the photoelectric conversion layer, the lower electrode, and the protection film shown in FIG. 5K.

Next, the resist 200 is removed (see FIG. 5K), and the third insulating film 105 made of silicon nitride (SiN) is formed by, for example, plasma CVD, so as to cover the upper electrode 14b, the lower electrode 14a, and the photoelectric conversion layer 15 (see FIG. 5L).

Then, photolithography and wet etching are carried out, whereby an opening (not shown) of the third insulating film 105 is formed in the TFT area. Thereafter, the fourth insulating film 106 made of acrylic resin or siloxane-based resin is formed by, for example, slit-coating on the third insulating film 105. Then, by photolithography, an opening (not shown) of the fourth insulating film 106 is formed on the opening of the third insulating film 105 (see FIG. 5M). Through these steps, the contact hole CH2 (see FIG. 4A) passing through the third insulating film 105 and the fourth insulating film 106 is formed on the upper electrode 14b in the TFT area, though not shown in FIG. 5M.

Figure 5N:
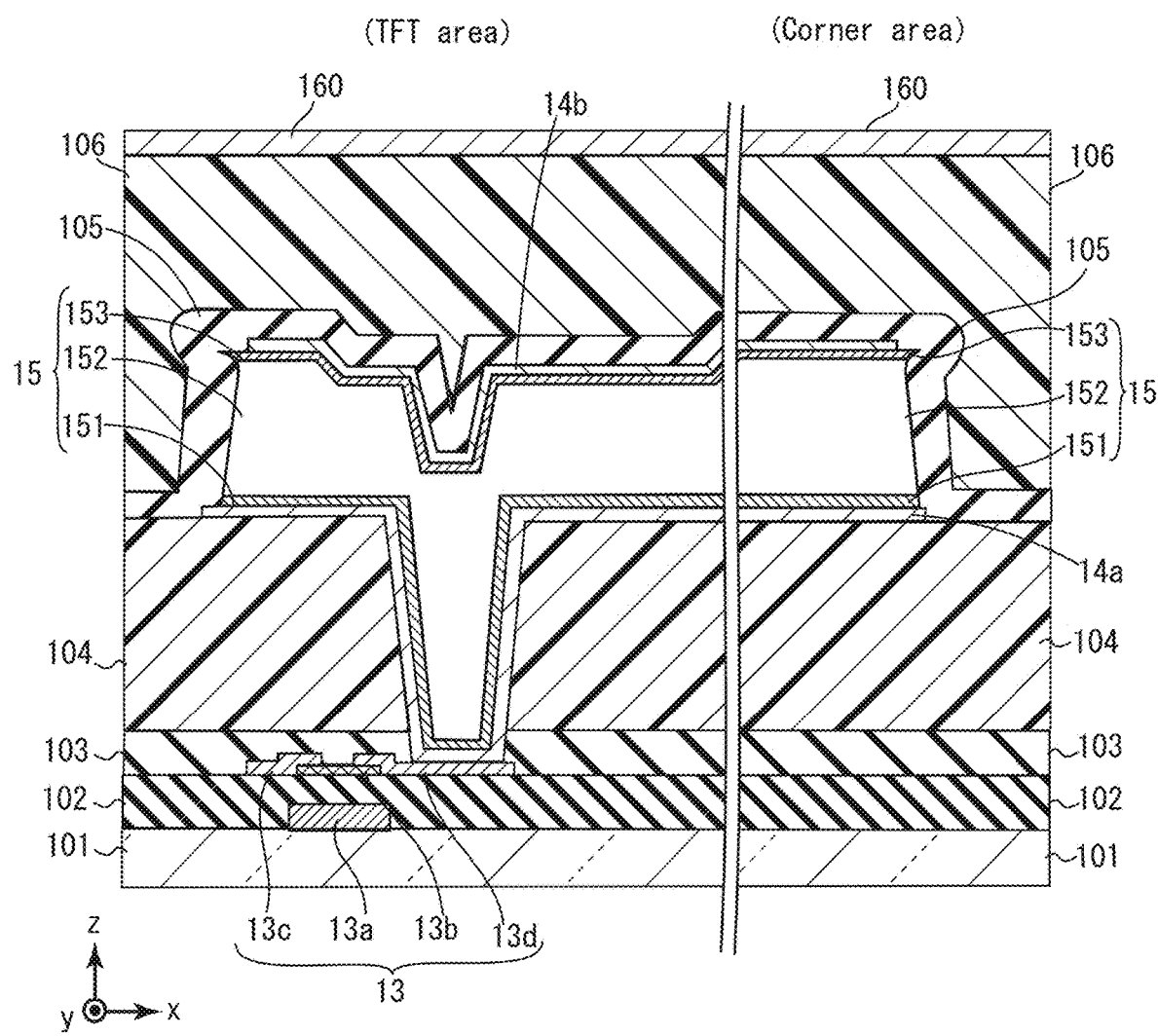
FIG. 5N is a cross-sectional view showing a step of forming a metal film on the fourth insulating film shown in FIG. 5M.
Figure 50:
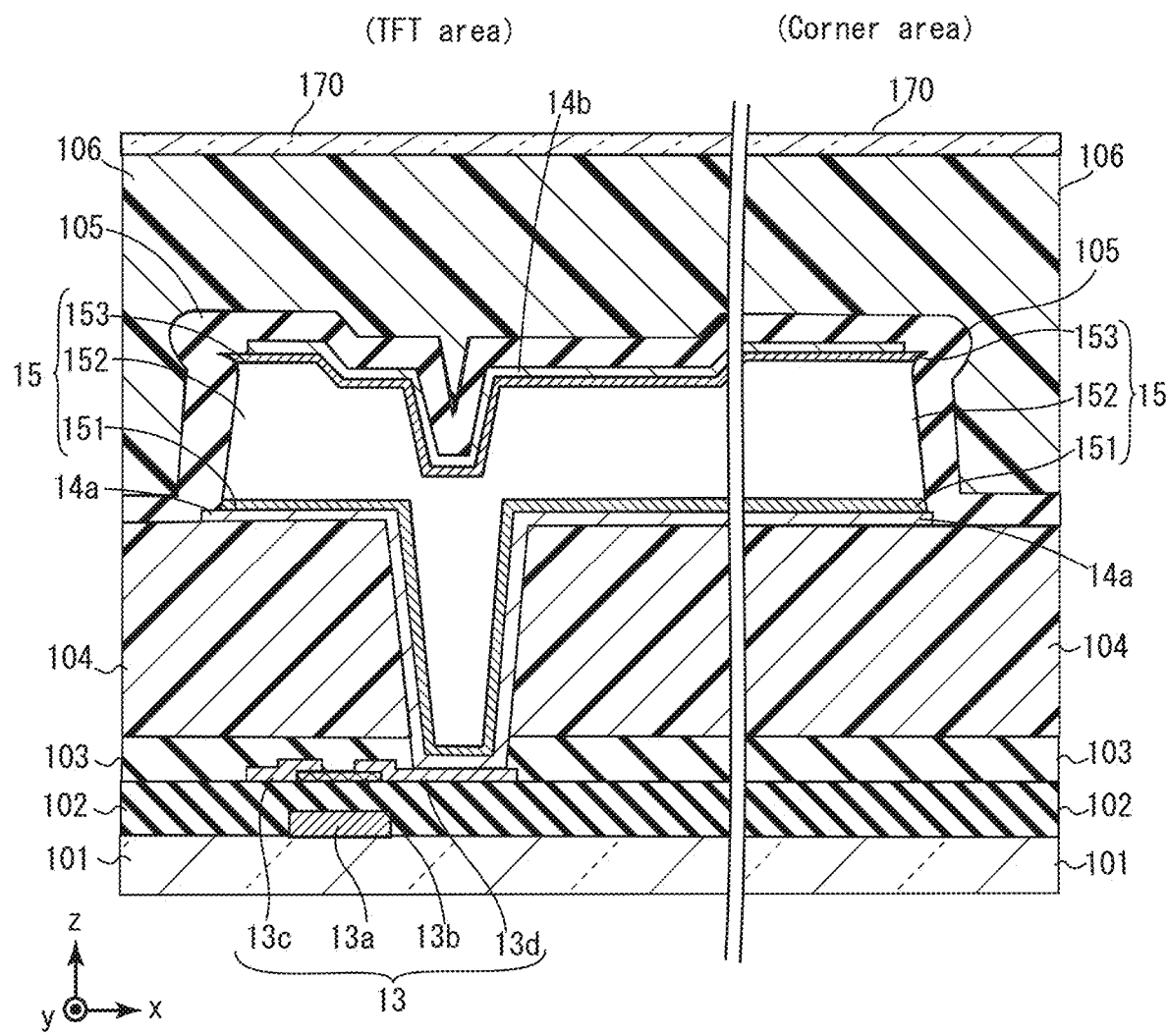

Next, a metal film 160 obtained by laminating molybdenum nitride (MoN), aluminum (Al), and titanium (Ti) in this order is formed on the fourth insulating film 106 by, for example, sputtering (see FIG. 5N). Then, photolithography and wet etching are carried out so as to pattern the metal film 160. Through these steps, the bias line 16 is formed on the fourth insulating film 106 in the TFT area (see FIG. 4A).

After the bias line 16 is formed (see FIG. 4A), the transparent conductive film 170 made of ITO is formed on the fourth insulating film 106 by, for example, sputtering so as to cover the bias line 16 (see FIG. 5O).

Figure 5P:
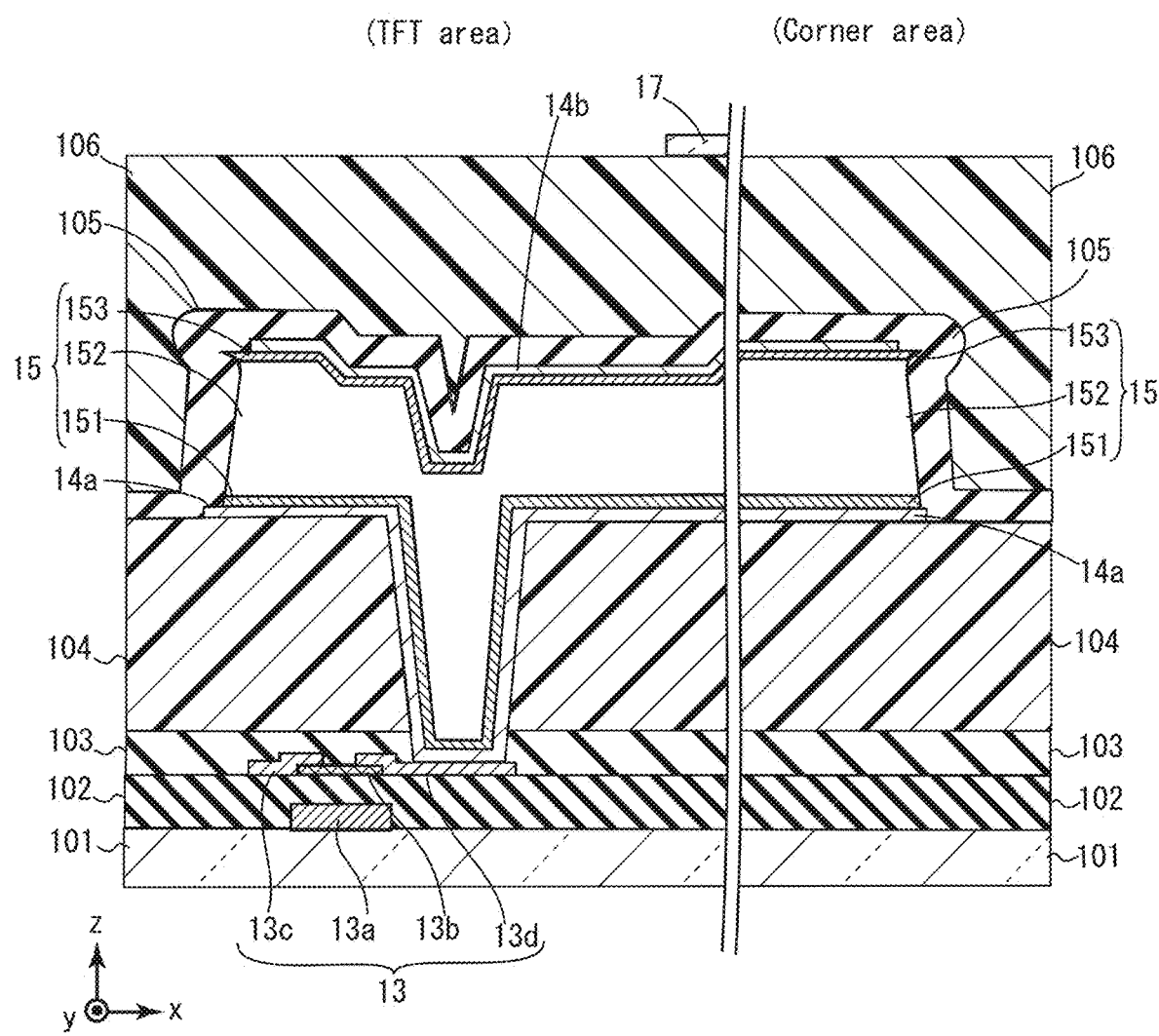
FIG. 5P is a cross-sectional view showing a step of patterning the transparent conductive film shown in FIG. 5O.

Then, photolithography and dry etching are carried out so as to pattern the transparent conductive film 170, whereby the transparent conductive film 17 is formed in the TFT area (see FIG. 5P). The transparent conductive film 17 is connected with the bias line 16 shown in FIG. 4A, and is connected with the upper electrode 14b through the contact hole CH2 (see FIG. 4A).

Figure 5Q:
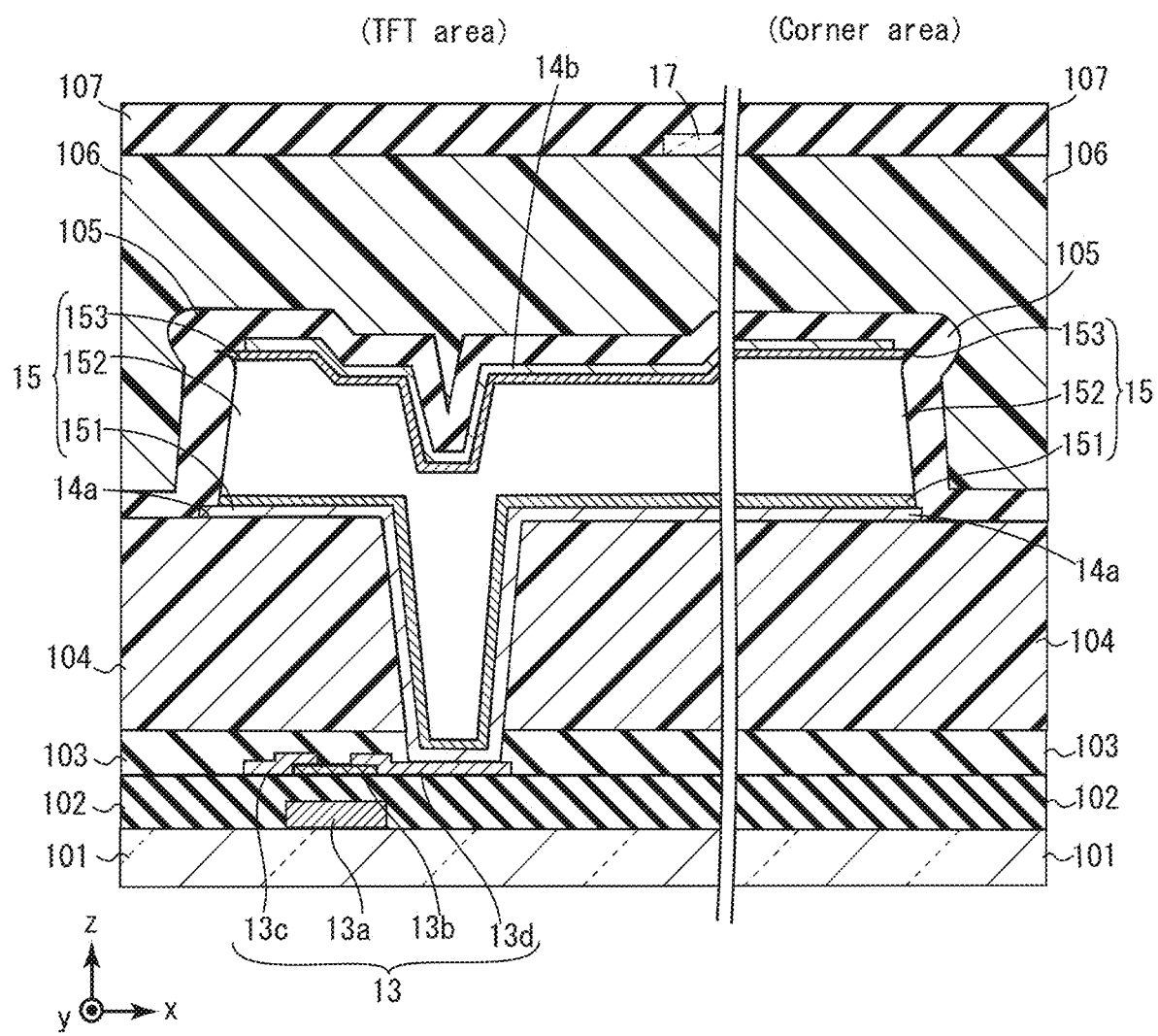
FIG. 5Q is a cross-sectional view showing a step of forming a fifth insulating film so that the fifth insulating film covers the transparent conductive film shown in FIG. 5P.
Figure 5R:
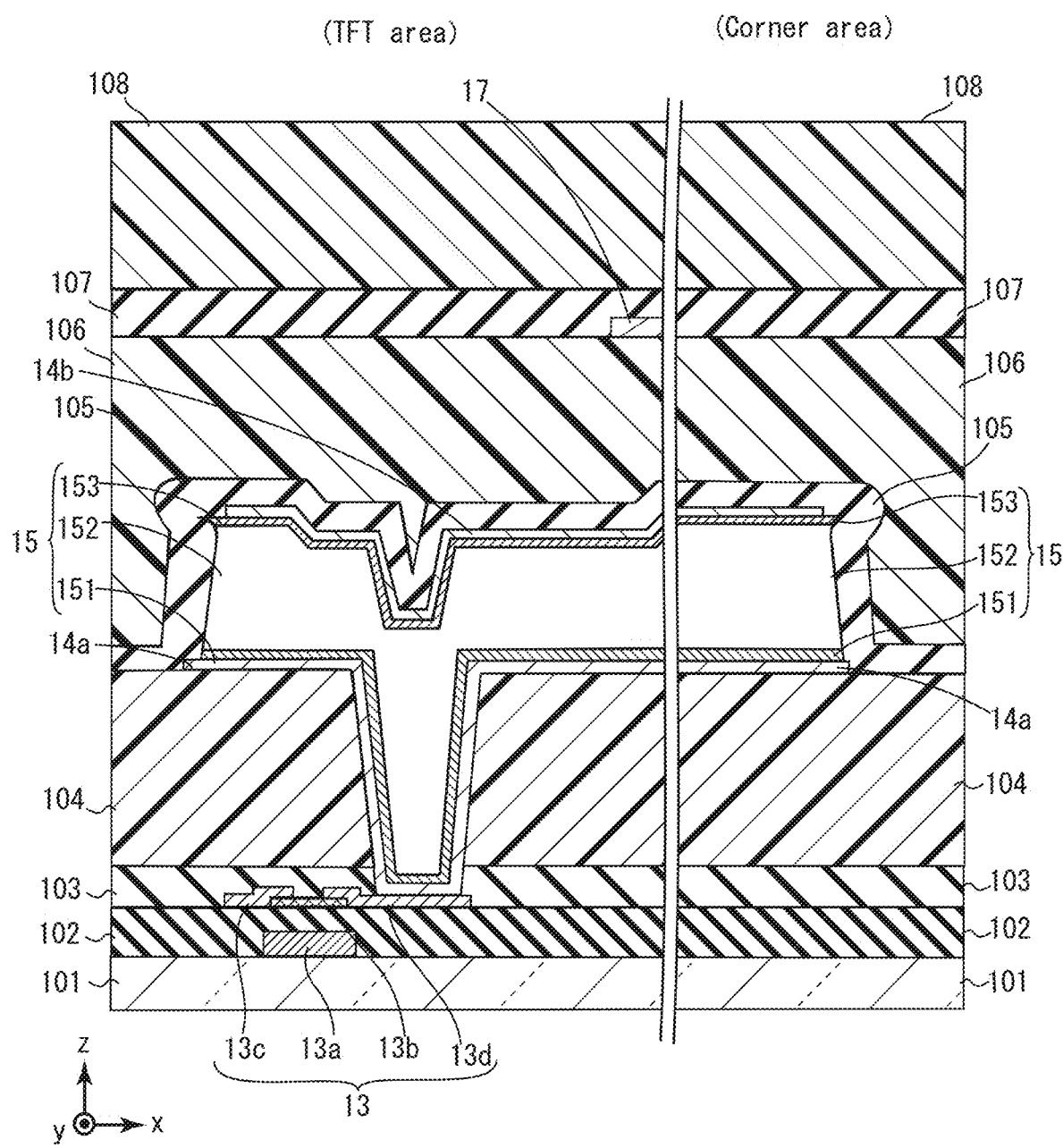
FIG. 5R is a cross-sectional view showing a step of forming a sixth insulating film on the fifth insulating film shown in FIG. 5Q.

Next, on the fourth insulating film 106, the fifth insulating film 107 made of silicon nitride (SiN) is formed by, for example, plasma CVD so as to cover the transparent conductive film 17 in the TFT area (see FIG. 5Q).

Subsequently, the sixth insulating film 108 made of acrylic resin or siloxane-based resin is formed on the fifth insulating film 107 by, for example, slit-coating (see FIG. 5R). Through these steps, the imaging panel 1 shown in FIGS. 4A and 4B is formed.

The method described above is the method for producing the imaging panel 1 in Embodiment 1. As described above, the resist 200 used when the photoelectric conversion layer 15 is formed is in a polygonal shape having four corner portions. With configuration, the exposure amount in the corner portions during the exposure when the resist 200 is formed does not excessively increase as compared with the exposure amount in the other portions, whereby the taper angles of the resist 200 in the corner portions and the taper angles of the resist 200 in the other portions are made almost identical. As a result, during dry etching, the resist 200 in the corner portions and the resist 200 in the other portions are recessed at identical levels. This causes the upper end portion of the p-type amorphous semiconductor layer 153 in any of the corner portions and the other portions to protrude toward the outer side with respect to the upper end portion of the intrinsic amorphous semiconductor layer 152, thereby having an inversely tapered shape. Such a configuration that the upper end portion of the p-type amorphous semiconductor layer 153 protrudes toward the outer side with respect to the upper end portion of the intrinsic amorphous semiconductor layer 152 makes it unlikely that the interface between the p-type amorphous semiconductor layer 153 and the intrinsic amorphous semiconductor layer 152 would be damaged by etching, thereby making it unlikely that leakage current would occur.

(Operation of X-ray Imaging Device 100)

Here, operations of the X-ray imaging device 100 shown in FIG. 1 are described. First, X-rays are emitted from the X-ray source 3. Here, the control unit 2 applies a predetermined voltage (bias voltage) to the bias line 16 (see FIG. 3 and the like). X-rays emitted from the X-ray source 3 are transmitted through an object S, and are incident on the scintillator 1A. The X-rays incident on the scintillator 1A are converted into fluorescence (scintillation light), and the scintillation light is incident on the imaging panel 1. When the scintillation light is incident on the photodiode 12 provided in each pixel in the imaging panel 1, the scintillation light is changed to charges by the photodiode 12 in accordance with the amount of the light. A signal according to the charges obtained by conversion by the photodiode 12 is read out through the source line 10 to the signal reading unit 2B (see FIG. 2 and the like) when the TFT 13 (see FIG. 3 and the like) is in the ON state according to a gate voltage (positive voltage) that is output from the gate control unit 2A through the gate line 11. Then, an X-ray image in accordance with the signal thus read out is generated in the control unit 2.

Embodiment 2

The present embodiment is described with reference to a photoelectric conversion layer that has corner portions that are different from the corner portions 15p in Embodiment 1.

Example 1

FIG. 7 is an enlarged view schematically showing a part of a photoelectric conversion layer 151 as an example of Embodiment 2. As shown in FIG. 7, the photoelectric conversion layer 151 has a corner portion 151p. The corner portion 151p in the present embodiment is a connecting part that connects a side 151x parallel to the X axis and a side 151y parallel to the Y axis in the photoelectric conversion layer 151. The corner portion 151$p$ has such a size that each length in the X-axis direction and in the Y-axis direction is 3 µm, as is the case with the corner portion 15$p$ of the photoelectric conversion layer 15 in of Embodiment 1.

The corner portion 151$p$ has four corners 151$pa$ to 151$pd$, each of which has an interior angle θ1 of about 150°. Incidentally, an angle θ1$a$ formed by the corner 151$pa$ with a line parallel to the side 15$px$ is 30°, an angle θ1$b$ formed by the corner 151$pb$ with a line parallel to the side 151$x$ is 45°, an angle θ1$c$ formed by the corner 151$pc$ with a line parallel to the side 151$x$ is 60°, and an angle θ1$d$ formed by the corner 151$pd$ with a line parallel to the side 151$x$ is 90°.

The corner portion 151$p$ of the photoelectric conversion layer 151 has a greater number of corners as compared with the number of corners in the corner portion 151$p$ of the photoelectric conversion layer 15 in Embodiment 1 (see FIG. 3B), and the corner has a greater interior angle. In other words, the outline of the corner portion 151$p$ is curved more smoothly than the corner portion 15$p$ in Embodiment 1. In the step of exposing the resist used when the photoelectric conversion layer 151 is formed, therefore, the difference between the exposure amount in the corner portions and the exposure amount in the other portions is smaller as compared with Embodiment 1. As a result, it is easier to control the taper angles of the resist so as to achieve almost identical taper angles in the corner portions and that in the other portions, as compared with Embodiment 1, whereby recesses of the resist caused by dry etching thereafter tend to be at almost identical levels. The photoelectric conversion layer 151 formed with use of such a resist, therefore, tends to have such a configuration that the upper end portions of the p-type amorphous semiconductor layer 153 and the intrinsic amorphous semiconductor layer 152 have inversely tapered shapes, thereby being less influenced by etching damage, as compared with Embodiment 1.

Example 2

FIG. 8 is an enlarged view schematically showing a part of a photoelectric conversion layer 152 as an example of Embodiment 2. As shown in FIG. 8, the photoelectric conversion layer 152 has a corner portion 152$p$. The corner portion 152$p$ in the present embodiment is a connecting part that connects a side 152$x$ parallel to the X axis and a side 152$y$ parallel to the Y axis in the photoelectric conversion layer 152. The corner portion 152$p$ has such a size that each length in the X-axis direction and in the Y-axis direction is 3 µm, as is the case with the corner portion 15$p$ of the photoelectric conversion layer 15 in Embodiment 1.

The corner portion 152$p$ have six corners 152$pa$ to 152$pf$, each of which has an interior angle θ2 of about 165°. Incidentally, an angle θ2$a$ formed by the corner 152$pa$ with a line parallel to the side 152$x$ is 15°, an angle θ2$b$ formed by the corner 152$pb$ with a line parallel to the side 152$x$ is 30°, an angle θ2$c$ formed by the corner 152$pc$ with a line parallel to the side 152$x$ is 45°, an angle θ2$d$ formed by the corner 152$pd$ with a line parallel to the side 152$x$ is 60°, an angle θ2$e$ formed by the corner 152$pe$ with a line parallel to the side 152$x$ is 75°, and an angle θ2$f$ formed by the corner 152$pf$ with a line parallel to the side 152$x$ is 90°.

The outline of the corner portion 152$p$ of the photoelectric conversion layer 152 is more smoothly curved than the corner portion 151$p$ in Example 1 (see FIG. 7). In the step of exposing the resist used when the photoelectric conversion layer 152 is formed, therefore, the difference between the exposure amount in the corner portions and the exposure amount in the other portions is further smaller, and this makes it easier to control the taper angles of the resist so as to achieve almost identical taper angles in the corner portions and that in the other portions. This therefore allows the recesses of the resist caused by dry etching thereafter to tend to be at almost identical levels, as compared with Example 1. In Example 2, as compared with Example 1, it is therefore further easier to control the p-type amorphous semiconductor layer 153 and the intrinsic amorphous semiconductor layer 152 so that the upper end portions thereof are in inversely tapered shapes, which makes them further less influenced by etching damage.

In this way, as the outlines of the corner portions of the photoelectric conversion layer are more smoothly curved so as to be closer to a circular arc shape, the difference between the exposure amount in the corner portions and the exposure amount in the other portions is smaller, thereby making it easier to control the taper angles of the resist so as to achieve almost identical taper angles in the corner portions and that in the other portions. As a result, by dry etching carried out thereafter, the upper end portions of the p-type amorphous semiconductor layer 153 and the intrinsic amorphous semiconductor layer 152 can be caused to have inversely tapered shapes, which makes it possible to suppress the occurrence of leakage current due to influences of etching damage.

Embodiments of the present invention are described above, but these are merely examples for implementing the present invention. The present invention, therefore, is not limited to the above-described embodiments, and the above-described embodiments can be appropriately varied and implemented without departing from the spirit and scope of the invention.

(1) The shapes of the corner portions 15$p$, 151$p$, 152$p$ of the photoelectric conversion layers 15, 151, 152 in the above-described embodiments are merely examples. The photoelectric conversion layer may have a polygonal shape having a plurality of corner portions when viewed in a plan view, in which one corner portion has at least a plurality of corners that have interior angles of greater than 90°. In other words, the corner portion is a connecting part that connects one side of the photoelectric conversion layer that is parallel to a first direction, and another side thereof parallel to a second direction that is different from the first direction. This connecting part includes at least one line segment, and the length of the connecting part is smaller than the length of the above-mentioned side. A plurality of angles in one corner portion, that is, interior angles formed between both ends of the connecting part and the two sides, as well as interior angles formed between adjacent line segments in the connecting part, may not be 90° or smaller.

The invention claimed is:

1. An imaging panel that generates an image based on scintillation light that is obtained from X-rays transmitted through an object, the imaging panel comprising:
   a substrate; and
   a photoelectric conversion layer that is provided on the substrate and converts scintillation light into charges, wherein
   the photoelectric conversion layer has a polygonal shape including a plurality of corner portions when viewed in a plan view,
   each of the plurality of corner portions includes a plurality of corners each of which has an interior angle of greater than 90°,
   the photoelectric conversion layer includes a first semiconductor layer of a first conductive type, an intrinsic amorphous semiconductor layer in contact with the first semiconductor layer, and a second semiconductor layer of a second conductive type that is opposite to the first conductive type, the second semiconductor layer being in contact with the intrinsic semiconductor layer, and in the plurality of corner portions, and in an area other than the corner portions, at least an upper end portion of the second semiconductor layer protrudes toward an outer side of the photoelectric conversion layer, with respect to an upper end portion of the intrinsic semiconductor layer.

2. The imaging panel according to claim 1, wherein the interior angle of each of the plurality of corners is 135° or greater.

3. The imaging panel according to claim 1, further comprising:
   a thin film transistor formed on the substrate;
   an insulating film that covers the thin film transistor;
   an upper electrode provided on the photoelectric conversion layer; and
   a lower electrode that is provided under the photoelectric conversion layer and is connected with the thin film transistor, wherein
   the upper electrode and the lower electrode have approximately rectangular shapes, respectively, when viewed in the plan view, and
   a side end portion of the photoelectric conversion layer is arranged between a side end portion of the upper electrode and a side end portion of the lower electrode.

4. A method for producing an imaging panel that generates an image based on scintillation light that is obtained from X-rays transmitted through an object, the method comprising the steps of:
   forming a thin film transistor on a substrate;
   forming an insulating film on the thin film transistor;
   forming a contact hole in the insulating film, and forming a lower electrode connected through the contact hole with the thin film transistor;
   forming a first semiconductor layer of a first conductive type, an intrinsic amorphous semiconductor layer, and a second semiconductor layer of a second conductive type that is opposite to the first conductive type in this order so as to cover the lower electrode;
   forming an upper electrode on the second semiconductor layer;
   forming a resist in a polygonal shape including a plurality of corner portions when viewed in a view on the second semiconductor layer so as to cover the upper electrode; and
   etching the first semiconductor layer, the intrinsic semiconductor layer, and the second semiconductor layer so as to a photoelectric conversion layer in the polygonal shape; wherein
   each of the plurality of corner portions includes a plurality of corners each of which has an interior angle of greater than 90°,
   the etching is dry etching, and
   in the plurality of corner portions of the photoelectric conversion layer, and in an area thereof other than the plurality of corner portion, at least an upper end portion of the second semiconductor layer protrudes toward an outer side of the photoelectric conversion layer, with respect to an upper end portion of the intrinsic semiconductor layer.

* * * * *